(12) United States Patent
Kapoano et al.

(10) Patent No.: US 11,525,777 B2
(45) Date of Patent: Dec. 13, 2022

(54) OPTIMIZING SIGNAL-TO-NOISE RATIO IN OPTICAL IMAGING OF DEFECTS ON UNPATTERNED WAFERS

(71) Applicant: APPLIED MATERIALS ISRAEL LTD., Rehovot (IL)

(72) Inventors: Yechiel Kapoano, Omer (IL); Binyamin Kirshner, Elkana (IL); David Goldovsky, Dolev (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 14 days.

(21) Appl. No.: 17/243,548

(22) Filed: Apr. 28, 2021

(65) Prior Publication Data
US 2021/0349019 A1 Nov. 11, 2021

Related U.S. Application Data

(63) Continuation-in-part of application No. 16/861,094, filed on Apr. 28, 2020.

(51) Int. Cl.
*G01N 21/47* (2006.01)
*G01N 21/95* (2006.01)
*G02B 5/30* (2006.01)

(52) U.S. Cl.
CPC ......... *G01N 21/47* (2013.01); *G01N 21/9501* (2013.01); *G02B 5/3058* (2013.01);
(Continued)

(58) Field of Classification Search
CPC .. G01N 21/47; G01N 21/9501; G02B 5/3058; G02B 5/3083
See application file for complete search history.

(56) References Cited

U.S. PATENT DOCUMENTS 6,407,373 B1 * 6/2002 Dotan ................. H01L 29/7834
257/E29.267
6,670,610 B2 12/2003 Shemesh et al.
(Continued)

FOREIGN PATENT DOCUMENTS

EP 2652776 B1 8/2019

OTHER PUBLICATIONS

U.S. Appl. No. 16/861,094, "Non-Final Office Action", dated May 18, 2022, 13 pages.
(Continued)

*Primary Examiner* — Rebecca C Bryant
(74) *Attorney, Agent, or Firm* — Kilpatrick Townsend & Stockton LLP

(57) ABSTRACT

A system for optical imaging of defects on unpatterned wafers that includes an illumination module, relay optics, a segmented polarizer, and a detector. The illumination module is configured to produce a polarized light beam incident on a selectable area of an unpatterned wafer. The relay optics is configured to collect and guide, radiation scattered off the area, onto the polarizer. The detector is configured to sense scattered radiation passed through the polarizer. The polarizer includes at least four polarizer segments, such that (i) boundary lines, separating the polarizer segments, are curved outwards relative to a plane, perpendicular to the segmented polarizer, unless the boundary line is on the perpendicular plane, and (ii) when the area comprises a typical defect, a signal-to-noise ratio of scattered radiation, passed through the polarizer segments, is increased as compared to when utilizing a linear polarizer.

20 Claims, 15 Drawing Sheets
(7 of 15 Drawing Sheet(s) Filed in Color)

(52) U.S. Cl.
CPC ... *G02B 5/3083* (2013.01); *G01N 2021/4707* (2013.01); *G01N 2021/4792* (2013.01)

(56) References Cited

U.S. PATENT DOCUMENTS

| | | | |
|---|---|---|---|
| 8,169,613 B1* | 5/2012 | Biellak | G01N 21/8806 |
| | | | 356/369 |
| 8,709,269 B2 | 4/2014 | Shemesh | |
| 9,046,475 B2 | 6/2015 | Langer et al. | |
| 10,948,423 B2* | 3/2021 | Liu | G01N 21/21 |
| 2017/0276613 A1* | 9/2017 | Liu | G01N 21/8806 |
| 2020/0150054 A1* | 5/2020 | Leong | G01N 21/9501 |
| 2021/0333719 A1* | 10/2021 | Kapoano | G03F 7/7065 |
| 2021/0349019 A1* | 11/2021 | Kapoano | G03F 7/7065 |

OTHER PUBLICATIONS

U.S. Appl. No. 16/861,094, "Notice of Allowance", dated Aug. 23, 2022, 9 pages.
U.S. Appl. No. 16/861,094, "Corrected Notice of Allowability", dated Sep. 7, 2022, 3 pages.

* cited by examiner

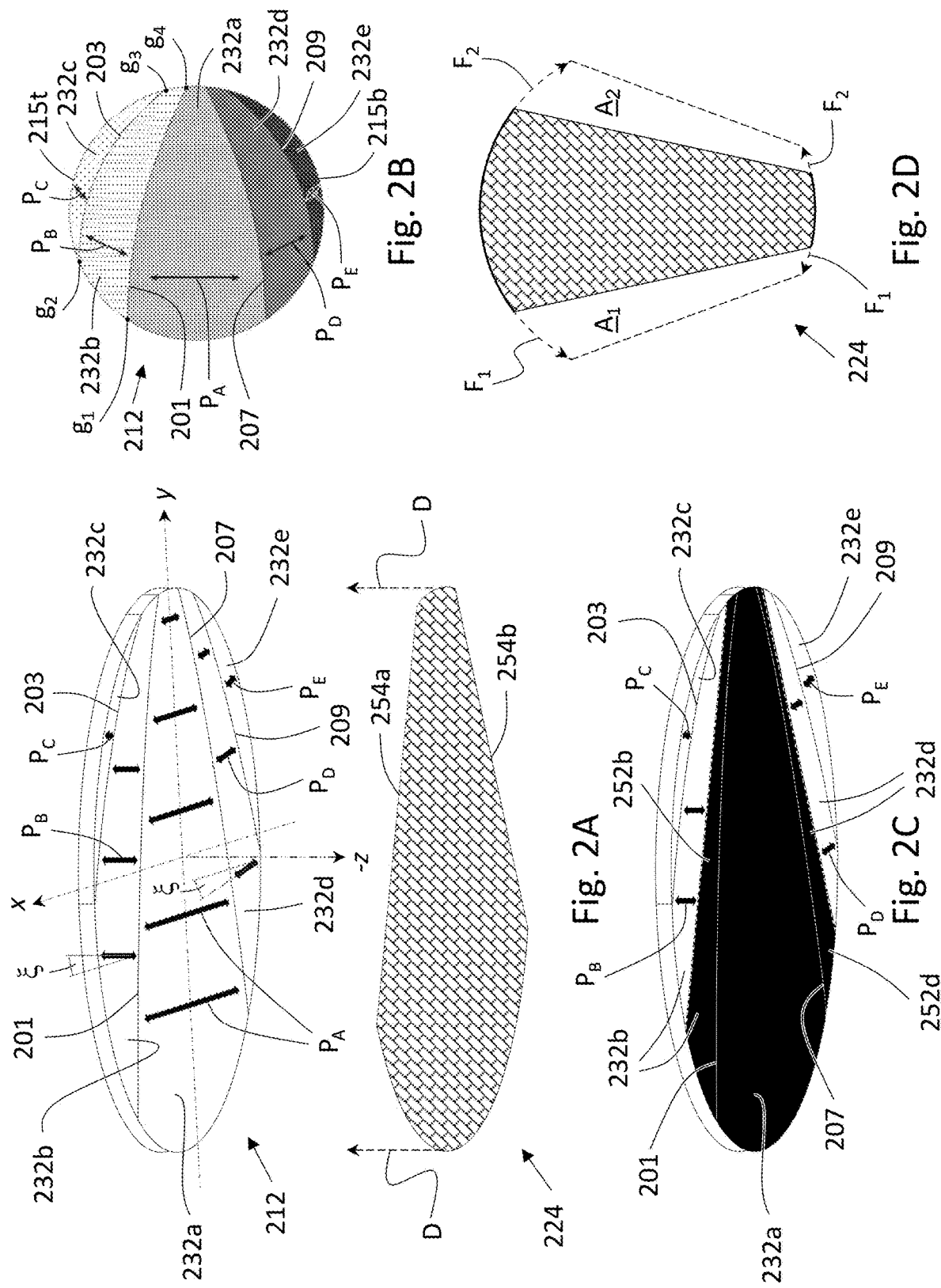

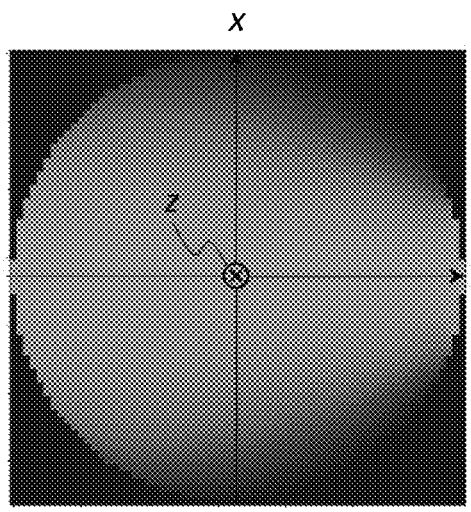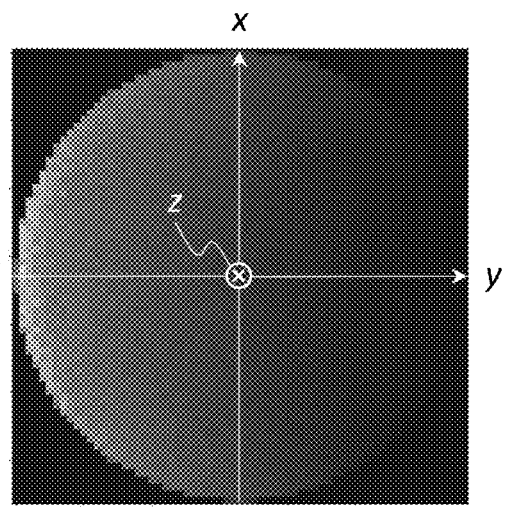
Fig. 10A　　　　　　　　Fig. 10B
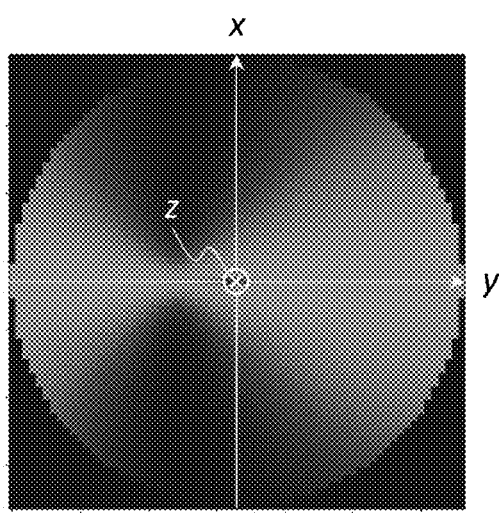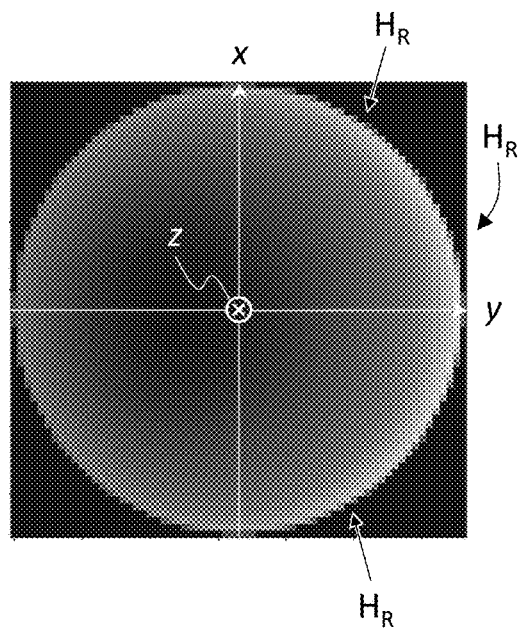
Fig. 10C　　　　　　　　Fig. 10D

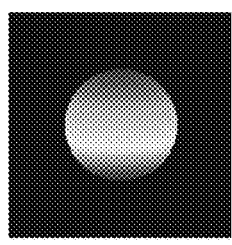
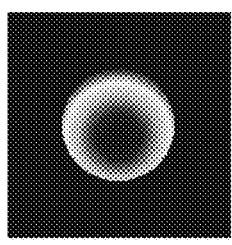
Fig. 11A
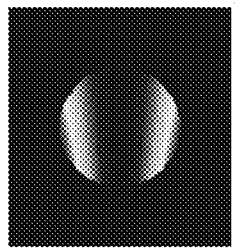
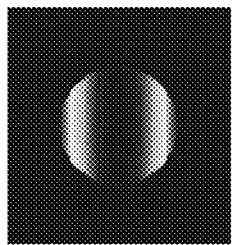
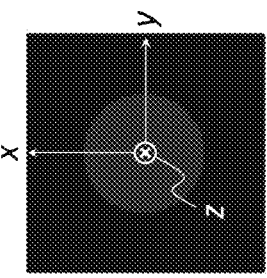
Fig. 11B
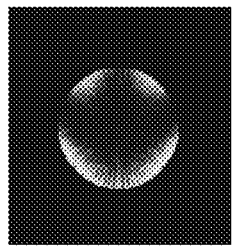
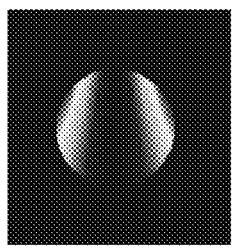
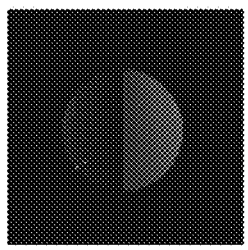
Fig. 11C
Fig. 11D
Fig. 11E

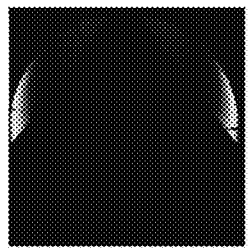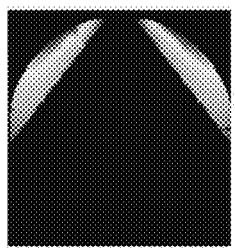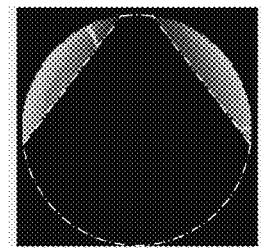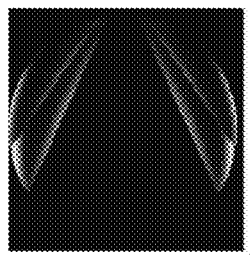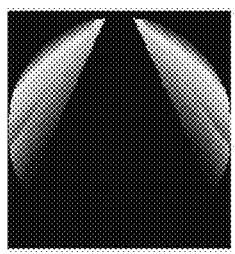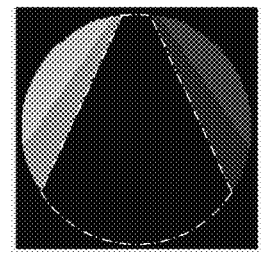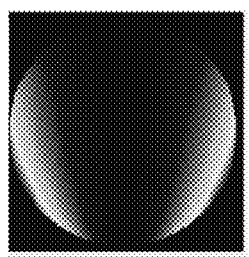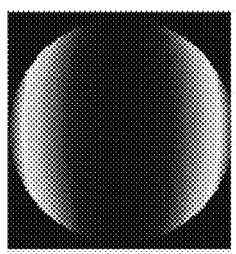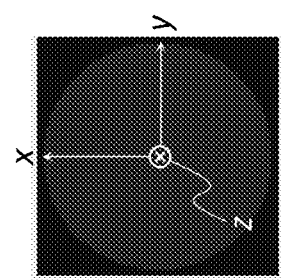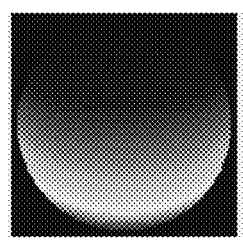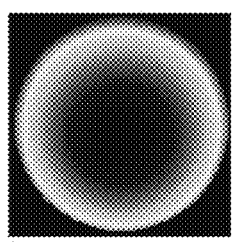
Fig. 14A Fig. 14B Fig. 14C Fig. 14D Fig. 14E

OPTIMIZING SIGNAL-TO-NOISE RATIO IN OPTICAL IMAGING OF DEFECTS ON UNPATTERNED WAFERS

CROSS REFERENCE TO RELATED APPLICATIONS

This application is a continuation-in-part of U.S. application Ser. No. 16/861,094, filed Apr. 28, 2020, which is incorporated by reference herein in its entirety for all purposes.

TECHNICAL FIELD

The present disclosure relates generally to signal-to-noise ratio amplification in optical imaging of defects on unpatterned wafers.

BACKGROUND OF THE INVENTION

One of the main challenges in optical imaging of defects on unpatterned (blanket) wafers is the discrimination of a defect signal from background noise due to light scattered off a wafer. This challenge exists both in optical inspection of unpatterned wafers and in unpatterned wafer defect review, wherein, in order to achieve high-throughput, up-to-date (e.g. corrected) defect maps must be obtained before imaging the defects with a scanning-electron microscope (SEM). For this reason, e-beam based (i.e. SEM-based) unpatterned wafer defect review systems typically include an optical imaging subsystem. The optical imaging subsystem is employed to update a defect map (obtained from the optical inspection system, which was employed to inspect the wafer for defects) prior to employing the SEM to obtain high-resolution images of the defects.

BRIEF SUMMARY OF THE INVENTION

Aspects of the disclosure, according to some embodiments thereof, relate to systems and methods for increasing signal-to-noise ratio (SNR) in optical imaging of defects on unpatterned (blanket) wafers, whether as part of unpatterned wafer inspection or unpatterned wafer defect review. More specifically, but not exclusively, aspects of the disclosure, according to some embodiments thereof, relate to SNR improvement in optical-based correction of defect maps in e-beam based protocols for unpatterned wafer defect review.

Thus, according to an aspect of some embodiments, there is provided a system for optical imaging of defects on unpatterned wafers. The system includes an illumination module, relay optics, a segmented polarizer, and a detector. The illumination module is configured to produce a substantially polarized light beam incident on a selectable illumination area of an unpatterned wafer. The relay optics is configured to collect and guide, radiation scattered off the illumination area, onto the segmented polarizer. The detector is configured to sense scattered radiation passed through the segmented polarizer. The segmented polarizer includes at least four polarizer segments characterized by respective dimensions and polarization directions, such that: (i) Each of boundary lines, separating the polarizer segments, substantially curves outwards relative to a plane, perpendicular to the segmented polarizer, unless the boundary line is on the perpendicular plane. (ii) When the illumination area includes a typical defect (for example, a sphere-shaped defect), a signal-to-noise ratio (SNR) of scattered radiation, generated in the scattering of the incident light beam from the illumination area and passed (i.e. filtered) through the polarizer segments, is increased as compared to when utilizing a linear polarizer.

According to some embodiments of the system, each of the boundary lines—unless on the perpendicular plane—substantially curves away both (i) from a respective straight line on which the boundary line is suspended, and (ii) from the perpendicular plane. Each of the straight lines extends between a respective pair of points on a perimeter of the segmented polarizer. According to some such embodiments, the segmented polarizer is substantially shaped as a disc or substantially effectively defines as a disc (i.e. has a polarizing filters region(s) substantially defining a circle). The perimeter of the disc corresponds to a circumference of the disc and each of the straight lines corresponds to a respective chord.

According to some embodiments of the system, the perpendicular plane may substantially bisect (i.e. cut into two equal halves) the segmented polarizer. According to some such embodiments, the polarizer segments substantially jointly exhibit mirror symmetry about the incidence plane.

According to some embodiments of the system, the system is configured such that an incidence plane, defined by the incident light beam, coincides with the perpendicular plane.

According to some embodiments of the system, each boundary line, unless on an intersection of the perpendicular plane and the segmented polarizer, defines, together with (i) the intersection, and (ii) a respective pair of arcs on a circumference of the segmented polarizer, which extend from the respective boundary line to the intersection, a respective area that is substantially convex.

According to some embodiments of the system, the respective dimensions and polarization directions of the polarizer segments are such that, when the illumination area includes a typical defect, the SNR is substantially maximized.

According to some embodiments of the system, each of the polarizer segments is characterized by a respective polarization direction, such that, when the illumination area includes a typical defect, SNR of scattered radiation, generated in the scattering of the incident light beam from the illumination area, and passed through the polarizer segment, is substantially maximized.

According to some embodiments of the system, the segmented polarizer is semi-continuous (e.g. including at least twenty segments). According to some such embodiments, the dimensions and polarization directions of the polarizer segments are such that, when the illumination area includes a typical defect, the SNR of scattered radiation, generated in the scattering of the incident light beam from the illumination area, and passed through the polarizer segments, is increased as compared to when utilizing a radial polarizer.

According to some embodiments of the system, the segmented polarizer includes about twenty, about fifty, or about a hundred or more polarizer segments (each characterized by a different polarization angle). Each of the above possibilities corresponds to separate embodiments.

According to some embodiments of the system, the boundary lines, which are farther from the perpendicular plane, are (comparatively) more curved.

According to some embodiments of the system, the boundary lines are substantially shaped as arcs of circles, which intersect the perpendicular plane.

According to some embodiments of the system, the illumination module is configured to produce the incident light beam at a non-zero angle with respect to an optical axis defined by the relay optics.

According to some embodiments of the system, the light beam is obliquely directed onto the unpatterned wafer.

According to some embodiments of the system, the incident light beam, produced by the illumination module, is substantially linearly polarized.

According to some embodiments of the system, the illumination module is configured to produce the incident light beam so as to be substantially p-polarized. According to some such embodiments, for each boundary line, unless the boundary line is on the perpendicular plane, the smaller a coordinate of a point on the boundary line, as measured along an axis defined by a tangential component of a wavevector of the incident light beam, the greater a distance of the point from the perpendicular plane.

According to some embodiments of the system, the illumination module is configured to produce the incident light beam so as to be substantially p-polarized. According to some such embodiments, each of the polarizer segments substantially may narrow in a direction defined by a tangential component of a wavevector of the incident light beam.

According to some embodiments of the system, the segmented polarizer is substantially set on a pupil of the relay optics.

According to some embodiments of the system, an optical axis, defined by the relay optics, lies substantially on the perpendicular plane. According to some such embodiments, the optical axis is substantially normal to the unpatterned wafer. According to some alternative embodiments, the optical axis is tilted with respect to the wafer.

According to some embodiments of the system, the system further includes a waveplate, positioned between the segmented polarizer and the relay optics. According to some such embodiments, the waveplate includes a plurality of waveplate segments. Each waveplate segment may be configured to modify to a different extent, respectively, a phase between a vertical polarization component and a horizontal polarization component of scattered radiation arriving at the waveplate segment.

According to some embodiments of the system, each of the polarizer segments is a wire-grid polarizer.

According to some embodiments of the system, the polarizer segments are arranged in one or more groups of adjacently disposed strips. For each pair of adjacent polarizer segments, an absolute difference between polarization angles, defined by the polarization directions of each of the (two) polarizer segments in the pair, is smaller than each of absolute deviations of polarization angles of background noise radiation arriving at each of the of the polarizer segments in the pair, respectively.

According to some embodiments of the system, respective polarization directions of the polarizer segments are substantially parallel to respective tangents to an ellipse, which is bisected by the perpendicular plane, and whose center is positioned farther than a center of the segmented polarizer, as measured along an axis, defined by a tangential component of a wavevector of the incident light beam.

According to some embodiments of the system, polarization directions of polarizer segments in a first half-circle of the segmented polarizer—positioned to the left of a first axis, when facing in a direction defined by a tangential component of a wavevector of the incident light beam—may be rotated clockwise from a second axis, which is parallel to the segmented polarizer and perpendicular to the first axis, such that the farther the polarizer segment from the perpendicular plane, the greater the rotation thereof. Polarization directions of polarizer segments in a second half-circle of the segmented polarizer, which is complementary to the first half-circle, are rotated anti-clockwise (counter-clockwise) from the second axis, such that the farther the polarizer segment from the perpendicular plane, the greater the rotation thereof. According to some such embodiments, the polarization directions in the first half-circle may increase from about 0° (e.g. 0.1°, 0.5°, 1°, 3°, 5°, or 10°) to about 45° or even about 60°, And the polarization directions in the second half-circle may decrease from about 0° (e.g. −0.1°, −0.5°, −1°, −3°, −5°, or)−10° to about −45° or even about −60°.

According to some embodiments the system, the polarizer segments are substantially complementary and substantially fully encompass the segmented polarizer (i.e. the polarizer segments extend over at least 80% of the area the segmented polarizer).

According to some embodiments of the system, the at least four polarizer segments are non-complementary.

According to some embodiments of the system, the segmented polarizer includes one or more opaque sections.

According to some embodiments of the system, the system further includes an optical mask configured to prevent one or more regions on the segmented polarizer from being exposed to radiation scattered off an unpatterned wafer irradiated by the illumination module, and thereby increase a SNR of scattered radiation passed through the segmented polarizer. Each of at least four of the polarizer segments is configured to have at least a part thereof exposed to the scattered radiation.

According to some embodiments of the system, the one or more regions on the segmented polarizer include one or more additional polarizer segments (distinct from the at least four polarizer segments).

According to some embodiments of the system, the incident light beam is substantially s-polarized.

According to some embodiments of the system, the incident light beam is substantially linearly polarized at an intermediate polarization between p-polarization and s-polarization.

According to some embodiments of the system, the illumination module is configured to produce the incident light beam at a non-zero angle with respect to an optical axis, defined by the relay optics.

According to some embodiments of the system, the incident light beam, produced by the illumination module, is obliquely directed onto the unpatterned wafer.

According to some embodiments of the system, the incident light beam, produced by the illumination module, is a laser beam.

According to some embodiments of the system, the polarization angles of adjacent segments, from the least four polarizer segments, differ by about 15°, about 10°, about 8°, about 6°, about 5°, about 4°, about 3°, about 2°, about 1°, or even less. Each possibility corresponds to separate embodiments. The polarization angle of a polarized segment is defined by the polarization direction of the polarized segment.

According to an aspect of some embodiments, there is provided a method for optical imaging of defects on unpatterned wafers. The method includes:

Irradiating an area of an unpatterned wafer with a substantially polarized incident light beam.

Employing relay optics to collect and guide, radiation scattered off the region, onto a segmented polarizer including at least four polarizer segments.

Respective dimensions and polarization directions of the polarizer segments are such that (i) each of boundary lines, separating the polarizer segments, substantially curves outwards relative to a plane, perpendicular to the segmented polarizer, unless the boundary line is on the perpendicular plane, and (ii) when the irradiated area includes a typical defect, a signal-to-noise ratio (SNR) of scattered radiation, generated in the scattering of the incident light beam from the irradiated area and passed through the polarizer segments, is increased as compared to when utilizing a linear polarizer.

According to some embodiments of the method, each of the boundary lines—unless on the perpendicular plane—substantially curves away both (i) from a respective straight line on which the boundary line is suspended, and (ii) from the perpendicular plane. Each of the straight lines extends between a respective pair of points on a perimeter of the segmented polarizer. According to some such embodiments, the segmented polarizer is substantially or effectively shaped as a disc. The perimeter corresponds to a circumference of the disc and each of the straight lines corresponds to a respective chord.

According to some embodiments of the method, the perpendicular plane may substantially bisect (i.e. cut into two equal halves) the segmented polarizer. According to some such embodiments, the polarizer segments substantially jointly exhibit mirror symmetry about the perpendicular plane.

According to some embodiments of the method, an incidence plane, defined by the incident light beam, coincides with the perpendicular plane.

According to some embodiments of the method, each boundary line, unless on an intersection of the perpendicular plane and the segmented polarizer, defines, together with (i) the intersection, and (ii) a respective pair of arcs on a circumference of the segmented polarizer, which extend from the respective boundary line to the intersection, a respective area that is substantially convex.

According to some embodiments of the method, the respective dimensions and polarization directions of the polarizer segments are such that, when the irradiated area includes a typical defect, the SNR is substantially maximized.

According to some embodiments of the method, each of the polarizer segments is characterized by respective dimensions and a respective polarization direction, such that, when the irradiated area includes a typical defect, SNR of scattered radiation, generated in the scattering of the incident light beam from the irradiated area, and passed through the polarizer segment, is substantially maximized.

According to some embodiments of the method, the segmented polarizer is semi-continuous. According to some such embodiments, the dimensions and polarization directions of the polarizer segments are such that, when the irradiated area includes a typical defect, the SNR of scattered radiation, generated in the scattering of the incident light beam from the irradiated area, and passed through the polarizer segments, is increased as compared to when utilizing a radial polarizer.

According to some embodiments of the method, the at least four polarizer segments are substantially complementary, substantially fully encompassing (i.e. covering at least 80% of the area of) the segmented polarizer.

According to some embodiments of the method, the polarizer segments are non-complementary.

According to some embodiments of the method, the segmented polarizer includes one or more opaque sections.

According to some embodiments of the method, the method further includes utilizing an optical mask to prevent one or more regions on the segmented polarizer from being irradiated by the scattered radiation, such that the SNR of the scattered radiation, passed through the segmented polarizer, is increased.

According to some embodiments of the method, the one or more regions on the segmented polarizer include one or more additional polarizer segments (distinct from the at least four polarizer segments).

According to some embodiments of the method, the incident light beam is irradiated at a non-zero angle with respect to an optical axis, defined by the relay optics.

According to some embodiments of the method, the incident light beam is substantially linearly polarized.

According to some embodiments of the method, the incident light beam is substantially p-polarized. According to some such embodiments, for each boundary line, unless the boundary line is on the perpendicular plane, the smaller a coordinate of a point on the boundary line, as measured along an axis defined by a tangential component of a wavevector of the incident light beam, the greater a distance of the point from the perpendicular plane.

According to some embodiments of the method, the incident light beam is obliquely directed onto the unpatterned wafer.

According to some embodiments of the method, the segmented polarizer is substantially set on a pupil of (i.e. defined by) the relay optics.

According to some embodiments of the method, an optical axis, defined by the relay optics, lies substantially on an incidence plane of the incident light beam. According to some such embodiments, the optical axis is substantially normal (e.g. oriented at an angle between 80° and 90° relative) to the unpatterned wafer.

According to some embodiments of the method, the incident light beam is substantially s-polarized.

According to some embodiments of the method, the incident light beam is substantially linearly polarized at an intermediate polarization between p-polarization and s-polarization.

According to some embodiments of the method, the boundary lines are substantially shaped as arcs of circles, which intersect the perpendicular plane.

According to some embodiments of the method, the method further includes utilizing a waveplate, positioned between the segmented polarizer and the relay optics, to modify the polarization properties of scattered radiation arriving at the segmented polarizer.

According to some embodiments of the method, the waveplate includes a plurality of waveplate segments. Each waveplate segment is configured to modify to a different extent (i.e. by a different amount), respectively, a phase between a vertical polarization component and a horizontal polarization component of scattered radiation arriving at the waveplate segment.

According to some embodiments of the method, the incident light beam is an ultraviolet (UV) laser beam.

According to some embodiments of the method, each of the polarizer segments is a wire-grid polarizer.

According to some embodiments of the method, the polarizer segments are arranged in one or more groups of adjacently disposed strips. For each pair of adjacent polarizer segments, an absolute difference between polarization angles, defined by the polarization directions of each of the pair of polarizer segments is smaller than each of absolute deviations of polarization angles of background noise radiation arriving at each of the pair of polarizer segments, respectively.

According to some embodiments of the method, the polarization angles of adjacent segments, from the at least four polarizer segments, differ by no more than about 15°, about 10°, about 8°, about 6°, about 5°, about 4°, about 3°, about 2°, about 1°, or even less. Each possibility corresponds to separate embodiments. The polarization angle of a polarized segment is defined by the polarization direction of the polarized segment.

According to an aspect of some embodiments, there is provided a computerized method for unpatterned wafer defect review. The method includes an optical-based stage and a scanning-electron microscope (SEM) based stage. The optical-based stage includes:

Receiving an unpatterned wafer including one or more detected defects and a defect map specifying coordinates of the one or more detected defects.

Generating a corrected defect map by, for each of the one or more detected defects:

Implementing, with respect to an area of the unpatterned wafer—the area including the detected defect—the above-described method for increasing signal-to-noise ratio in optical imaging of defects on unpatterned wafers.

Forming an image of the detected defect from scattered radiation passed through the segmented polarizer.

Analyzing the formed image to correct, if necessary, the coordinates of the detected defect.

The SEM-based stage includes:

Employing a SEM to review the one or more defects, based on the corrected defect map.

Reviewing SEM-obtained images of the one or more defects.

According to an aspect of some embodiments, there is provided a computerized method for unpatterned wafer defect review. The method includes an optical-based stage and a SEM-based stage. The optical-based stage includes:

Receiving an unpatterned wafer including one or more detected defects and a defect map specifying coordinates of the one or more detected defects.

Generating a corrected defect map by, for each of the one or more detected defects:

Optically reviewing the defect by:

Irradiating an area including the defect with a substantially polarized, incident light beam.

Employing relay optics to collect and guide, radiation scattered off the area, onto a segmented polarizer including at least four polarizer segments.

Respective dimensions and polarization directions of the polarizer segments are such that (i) each of boundary lines, separating the polarizer segments, substantially curves outwards relative to a plane, perpendicular to the segmented polarizer, unless the boundary line is on the perpendicular plane, and (ii) when the irradiated area includes a typical defect, a signal-to-noise ratio (SNR) of scattered radiation, generated in the scattering of the incident light beam from the irradiated area and passed through the polarizer segments, is increased as compared to when utilizing a linear polarizer.

Forming an image of the detected defect from scattered radiation passed through the segmented polarizer.

Analyzing the formed image to correct, if necessary, the coordinates of the detected defect.

The SEM-based stage includes:

Employing a SEM to review the one or more defects, based on the corrected defect map.

Reviewing SEM-obtained images of the one or more defects.

According to some embodiments of the method, each of the boundary lines, substantially curves away both (i) from a respective straight line on which the boundary line is suspended, and (ii) from the perpendicular plane. Each of the straight lines extends between a respective pair of points on a perimeter of the segmented polarizer. According to some such embodiments, the segmented polarizer is substantially or effectively shaped as a disc. The perimeter corresponds to a circumference of the disc and each of the straight lines corresponds to a respective chord.

According to an aspect of some embodiments, there is provided a computerized method for optical inspection of unpatterned wafers. The method includes:

Implementing with respect to an unpatterned wafer the above-described method for increasing signal-to-noise ratio in optical imaging of defects on unpatterned wafers.

Employing a detector to sense scattered radiation passed through the segmented polarizer, thereby obtaining image data of the unpatterned wafer.

Analyzing the obtained image data to detect defects on the unpatterned wafer.

According to some embodiments of method, the respective dimensions and polarization direction of each of the at least four polarizer segments are such that, when the irradiated area includes a defect, an SNR of scattered radiation, passed through the polarizer segments, is substantially maximized.

According to an aspect of some embodiments, there is provided a computerized method for optical inspection of unpatterned wafers. The method includes:

An optical irradiation stage including:

Successively irradiating areas of an unpatterned wafer with a substantially polarized, incident light beam.

Employing relay optics to collect and guide, radiation scattered off each area, onto a segmented polarizer including at least four polarizer segments.

Employing a detector to sense scattered radiation passed through the segmented polarizer, thereby obtaining image data of the unpatterned wafer.

Analyzing the obtained image data to detect defects on the unpatterned wafer.

Respective dimensions and polarization directions of the polarizer segments are such that (i) each of boundary lines, separating the polarizer segments, substantially curves outwards relative to a plane, perpendicular to the segmented polarizer, unless the boundary line is on the perpendicular plane, and (ii) when an irradiated area includes a typical defect, a signal-to-noise ratio (SNR) of scattered radiation, generated in the scattering of the incident light beam from the irradiated area and passed through the polarizer segments, is increased as compared to when utilizing a linear polarizer.

According to some embodiments of the method, each of the boundary lines, substantially curves away both (i) from a respective straight line on which the boundary line is suspended, and (ii) from the perpendicular plane. Each of the straight lines extends between a respective pair of points on a perimeter of the segmented polarizer. According to some such embodiments, the segmented polarizer is substantially or effectively shaped as a disc. The perimeter corresponds to a circumference of the disc and each of the straight lines corresponds to a respective chord. According to some embodiments of the method, the respective dimensions and polarization direction of each of the at least four polarizer segments are such that, when the irradiated area includes a defect, the SNR of the scattered radiation, passed through the polarizer segments, is substantially maximized.

According to an aspect of some embodiments, there is provided a method for manufacturing a n≥4 segmented polarizer configured for increasing SNR in optical imaging of defects on unpatterned wafers. The method includes:

Obtaining scattering data indicative of a spatial dependence of a scattering cross-section on a pupil plane, whereon the segmented polarizer is to be set, under conditions of polarized light scattering off an unpatterned wafer area including a typical defect.

Based on the scattering data, obtaining substantially optimal dimensions and polarization angles of the n polarizer segments, by substantially maximizing, over the dimensions and polarization angles, an SNR of the scattered radiation, which would be passed through the n polarizer segments under the above-specified conditions.

Manufacturing the segmented polarizer in accordance with the obtained substantially optimal dimensions and polarization angles.

Certain embodiments of the present disclosure may include some, all, or none of the above advantages. One or more other technical advantages may be readily apparent to those skilled in the art from the figures, descriptions, and claims included herein. Moreover, while specific advantages have been enumerated above, various embodiments may include all, some, or none of the enumerated advantages.

Unless otherwise defined, all technical and scientific terms used herein have the same meaning as commonly understood by one of ordinary skill in the art to which this disclosure pertains. In case of conflict, the patent specification, including definitions, governs. As used herein, the indefinite articles "a" and "an" mean "at least one" or "one or more" unless the context clearly dictates otherwise.

Unless specifically stated otherwise, as apparent from the disclosure, it is appreciated that, according to some embodiments, terms such as "processing", "computing", "calculating", "determining", "estimating", "assessing", "gauging" or the like, may refer to the action and/or processes of a computer or computing system, or similar electronic computing device, that manipulate and/or transform data, represented as physical (e.g. electronic) quantities within the computing system's registers and/or memories, into other data similarly represented as physical quantities within the computing system's memories, registers or other such information storage, transmission or display devices.

Embodiments of the present disclosure may include apparatuses for performing the operations herein. The apparatuses may be specially constructed for the desired purposes or may include a general-purpose computer(s) selectively activated or reconfigured by a computer program stored in the computer. Such a computer program may be stored in a computer readable storage medium, such as, but not limited to, any type of disk including floppy disks, optical disks, CD-ROMs, magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the desired method(s). The desired structure(s) for a variety of these systems appear from the description below. In addition, embodiments of the present disclosure are not described with reference to any particular programming language. It will be appreciated that a variety of programming languages may be used to implement the teachings of the present disclosure as described herein.

Aspects of the disclosure may be described in the general context of computer-executable instructions, such as program modules, being executed by a computer. Generally, program modules include routines, programs, objects, components, data structures, and so forth, which perform particular tasks or implement particular abstract data types. Disclosed embodiments may also be practiced in distributed computing environments where tasks are performed by remote processing devices that are linked through a communications network. In a distributed computing environment, program modules may be located in both local and remote computer storage media including memory storage devices.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Some embodiments of the disclosure are described herein with reference to the accompanying figures. The description, together with the figures, makes apparent to a person having ordinary skill in the art how some embodiments may be practiced. The figures are for the purpose of illustrative description and no attempt is made to show structural details of an embodiment in more detail than is necessary for a fundamental understanding of the disclosure. For the sake of clarity, some objects depicted in the figures are not drawn to scale. Moreover, two different objects in the same figure may be drawn to different scales. In particular, the scale of some objects in a figure may be greatly exaggerated as compared to other objects in the (same) figure.

In the figures:

Figure 1A:
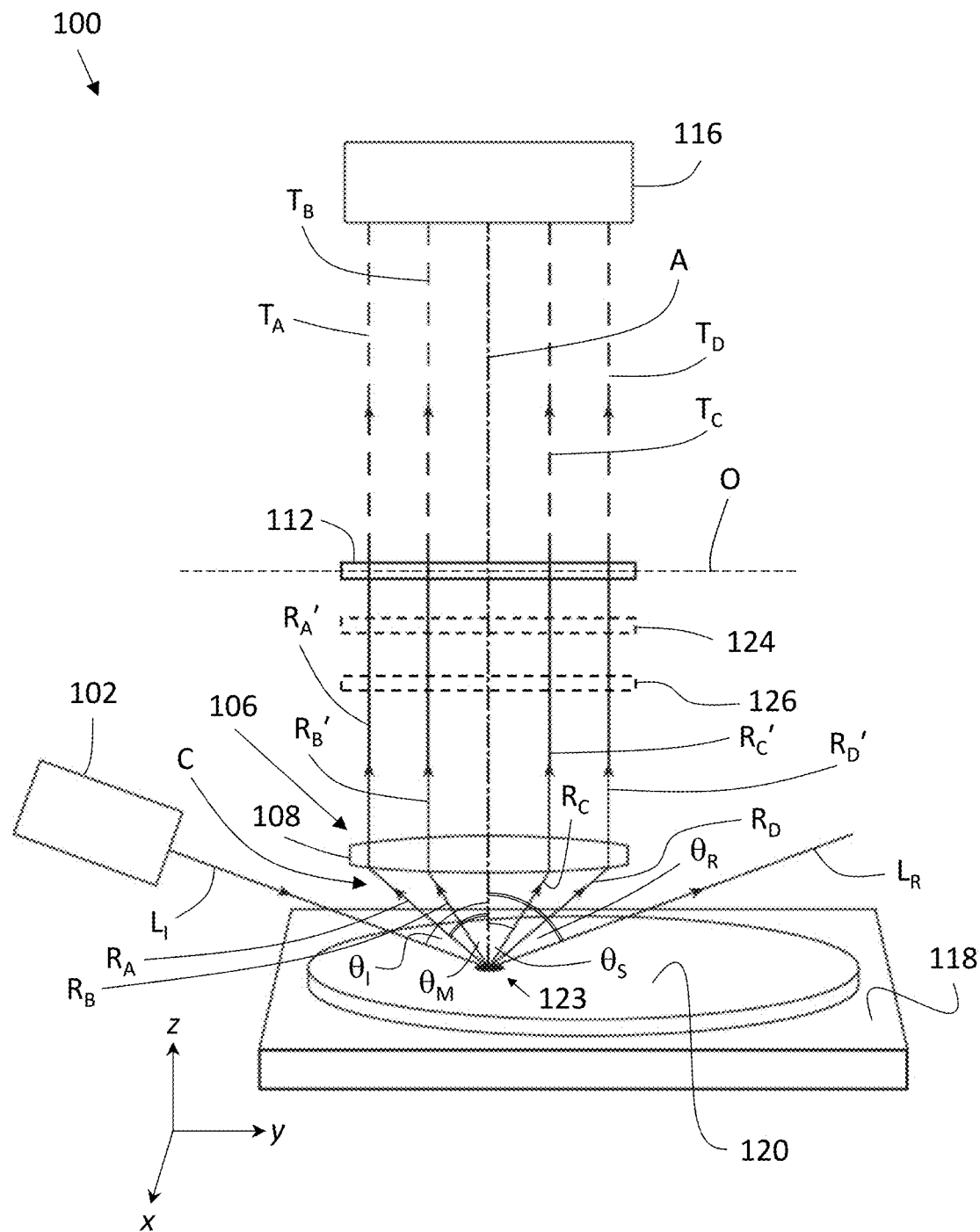
Figure 1C:
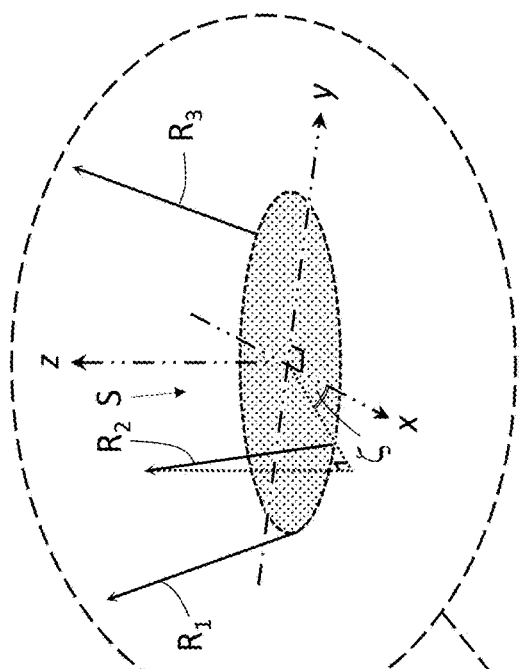
Figure 1B:
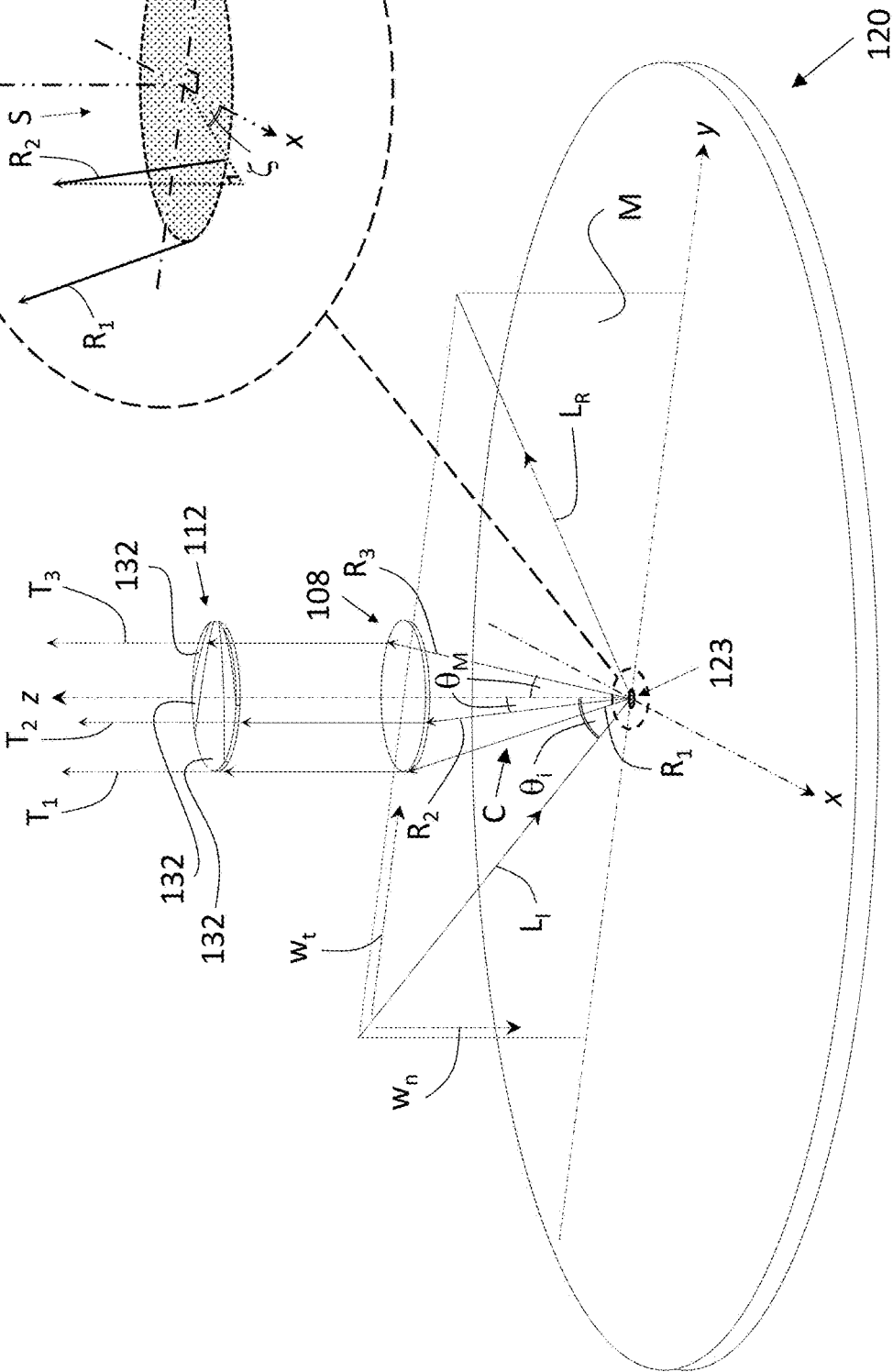
Figure 2E:
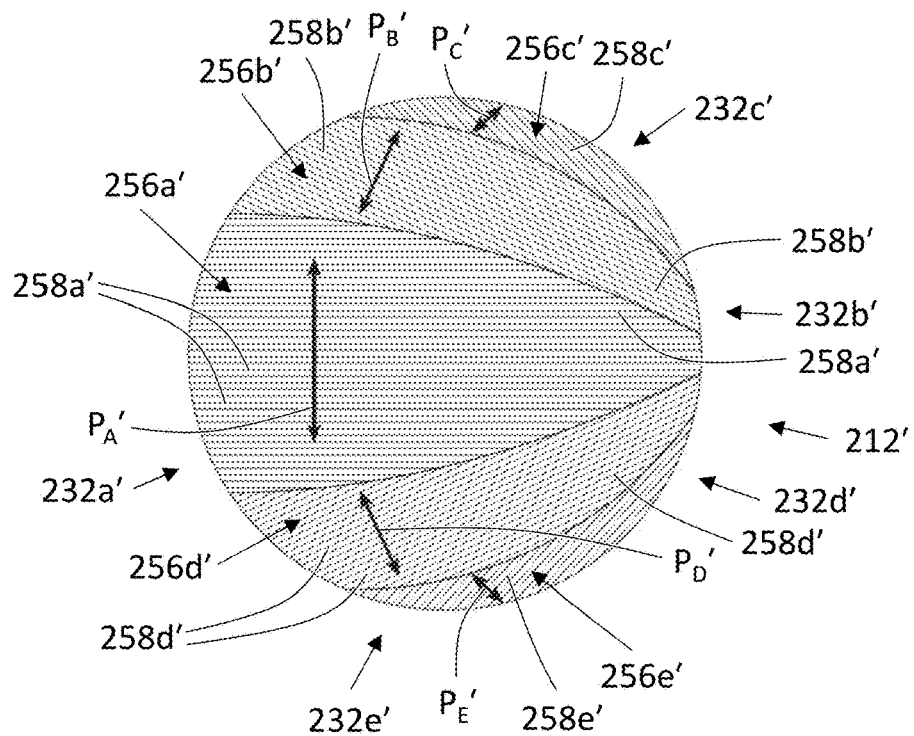
Figure 3:
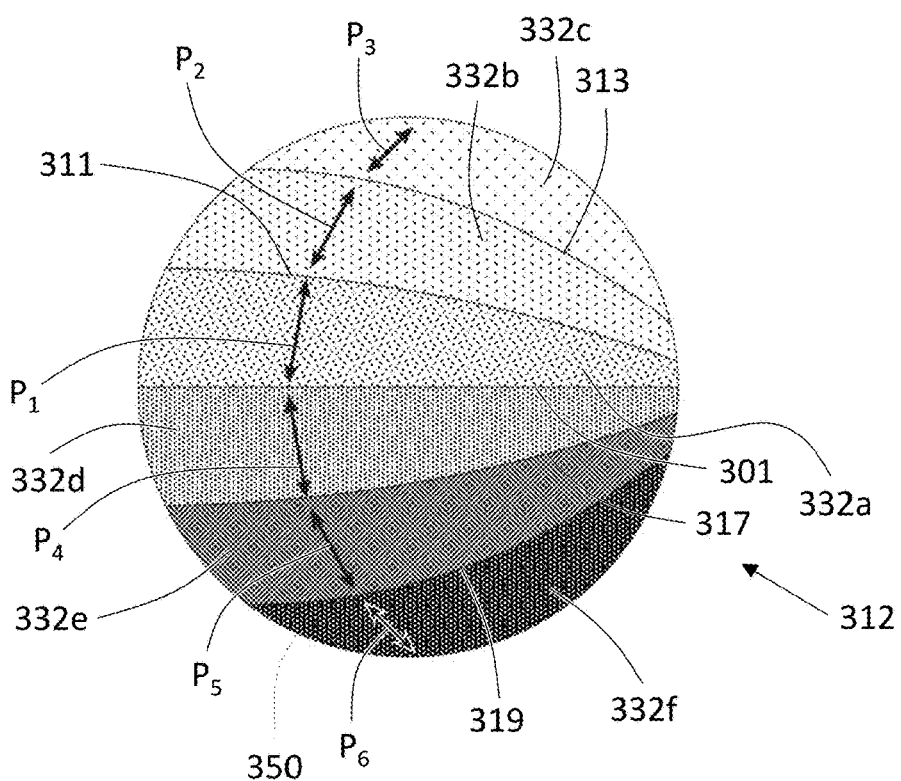
Figure 4A:
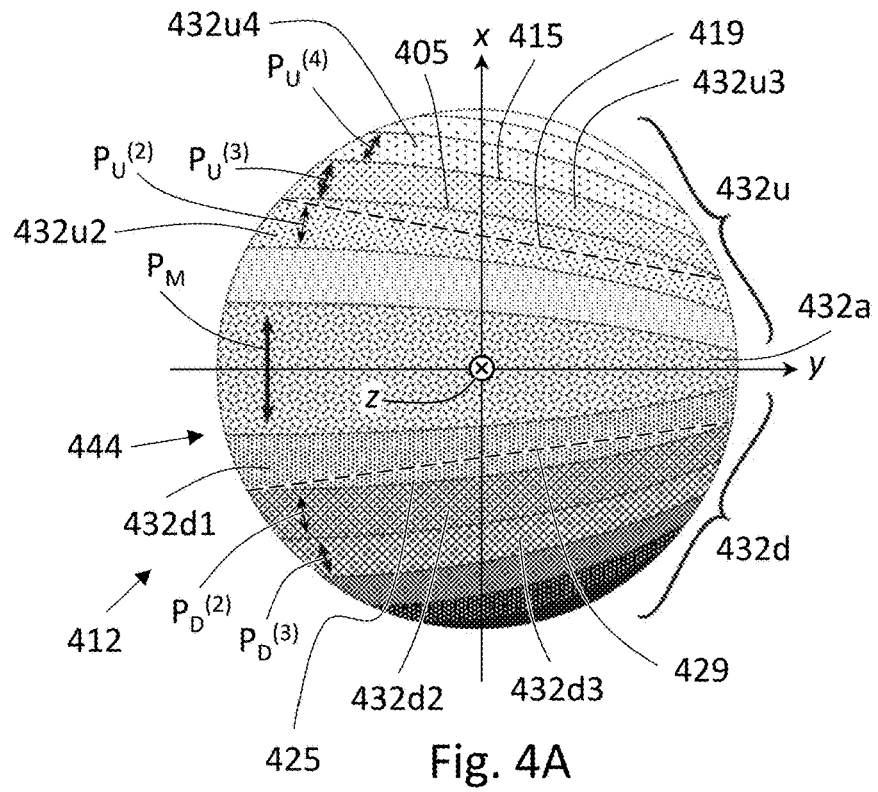
Figure 4B:
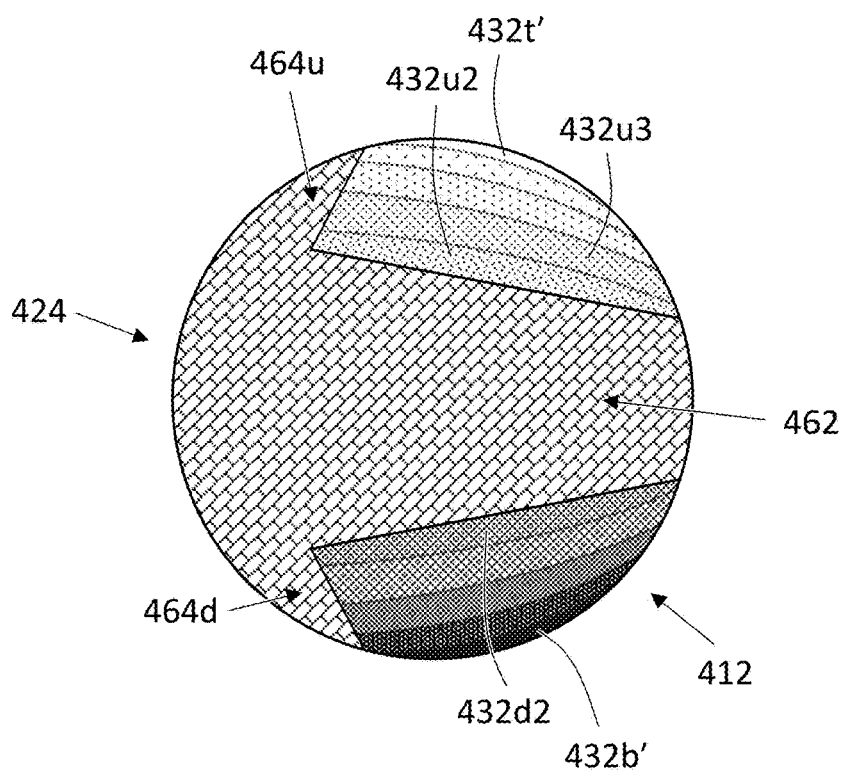
Figure 5:
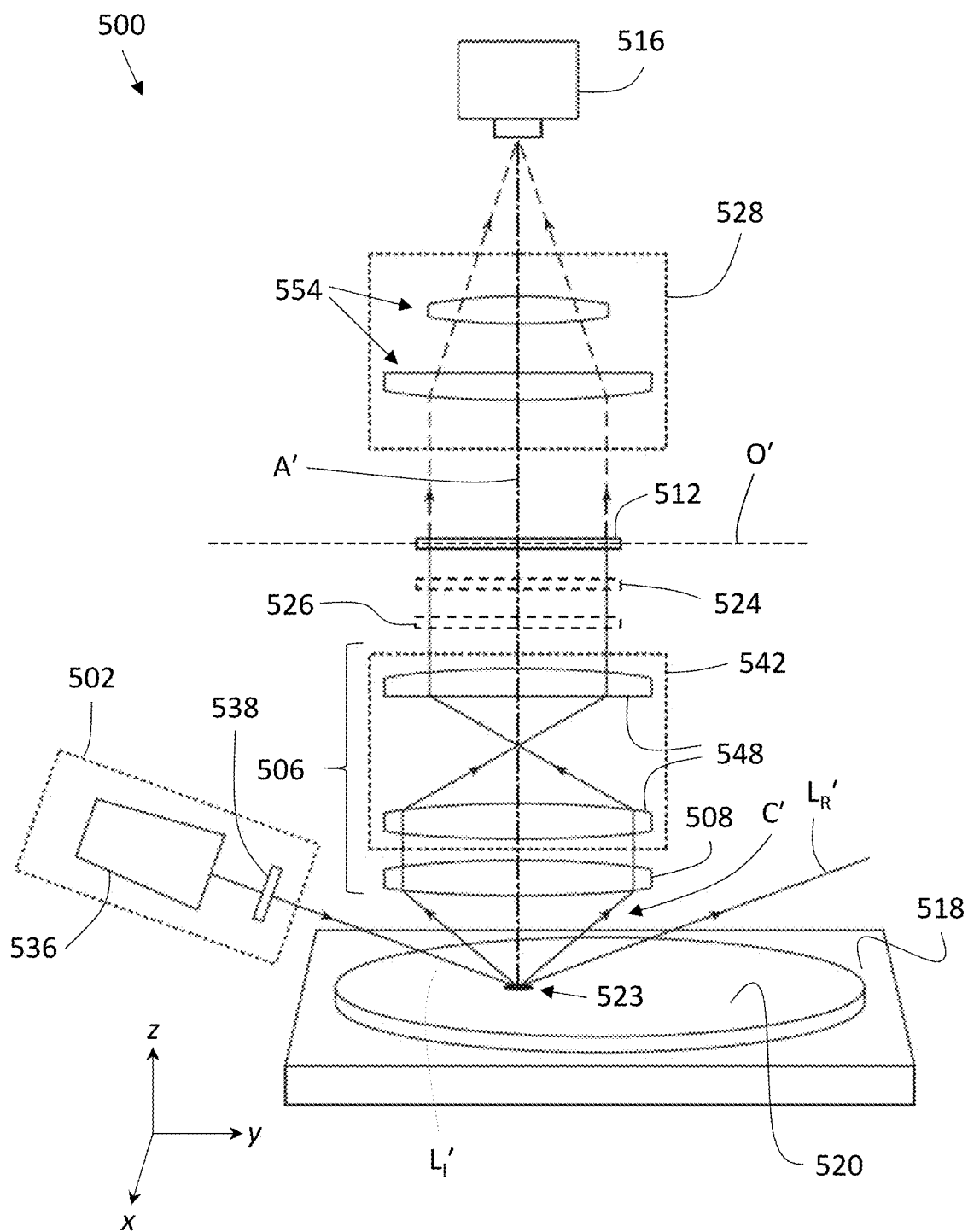
Figure 7:
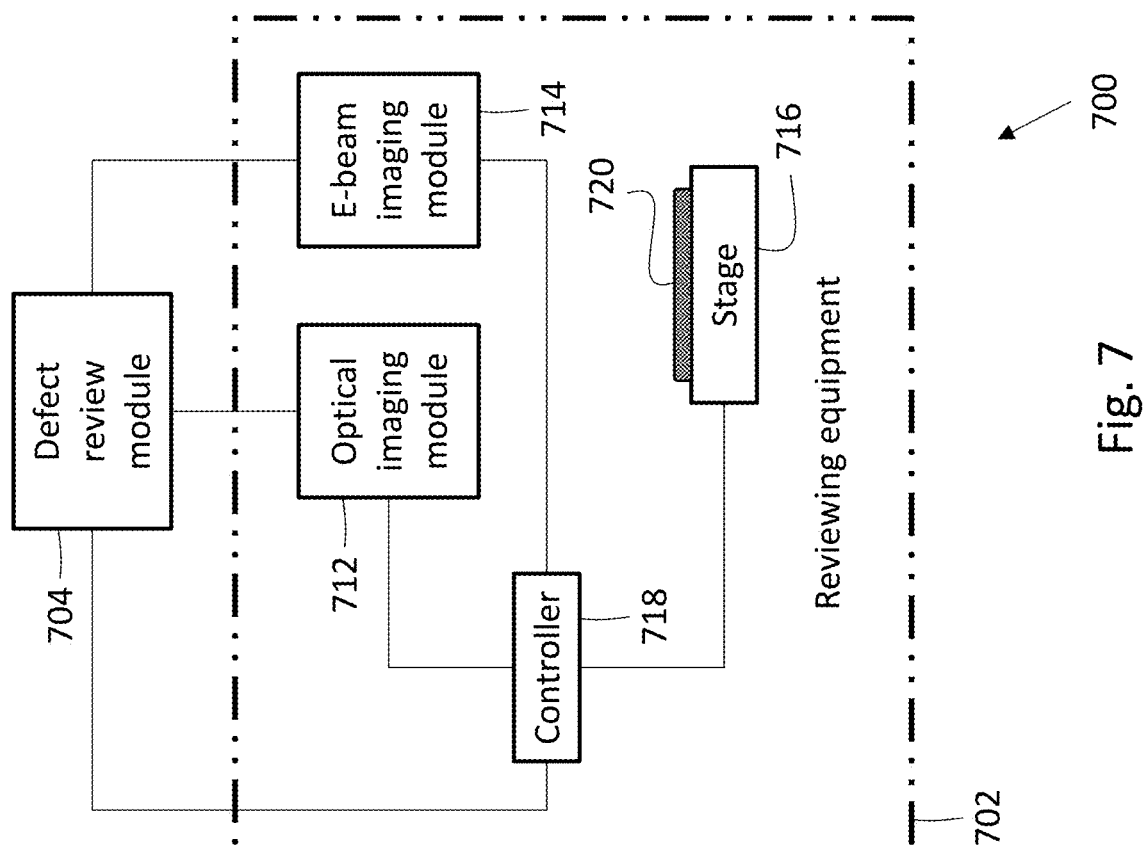
Figure 6:
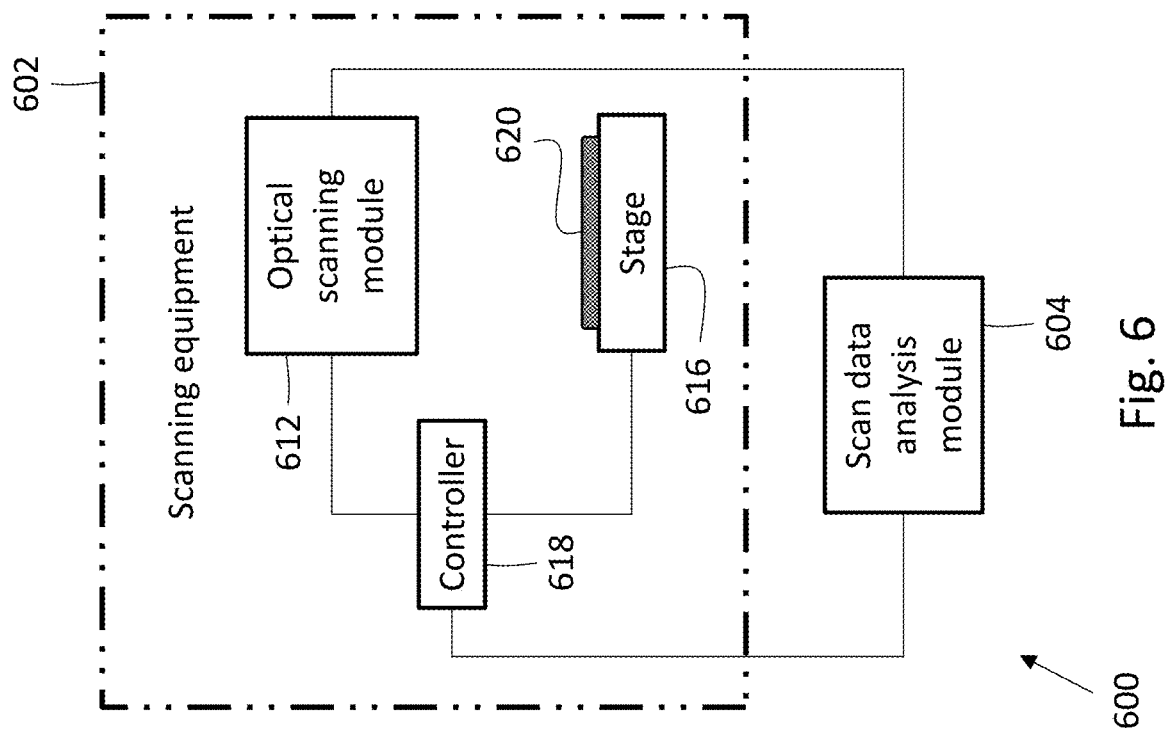
Figure 9:
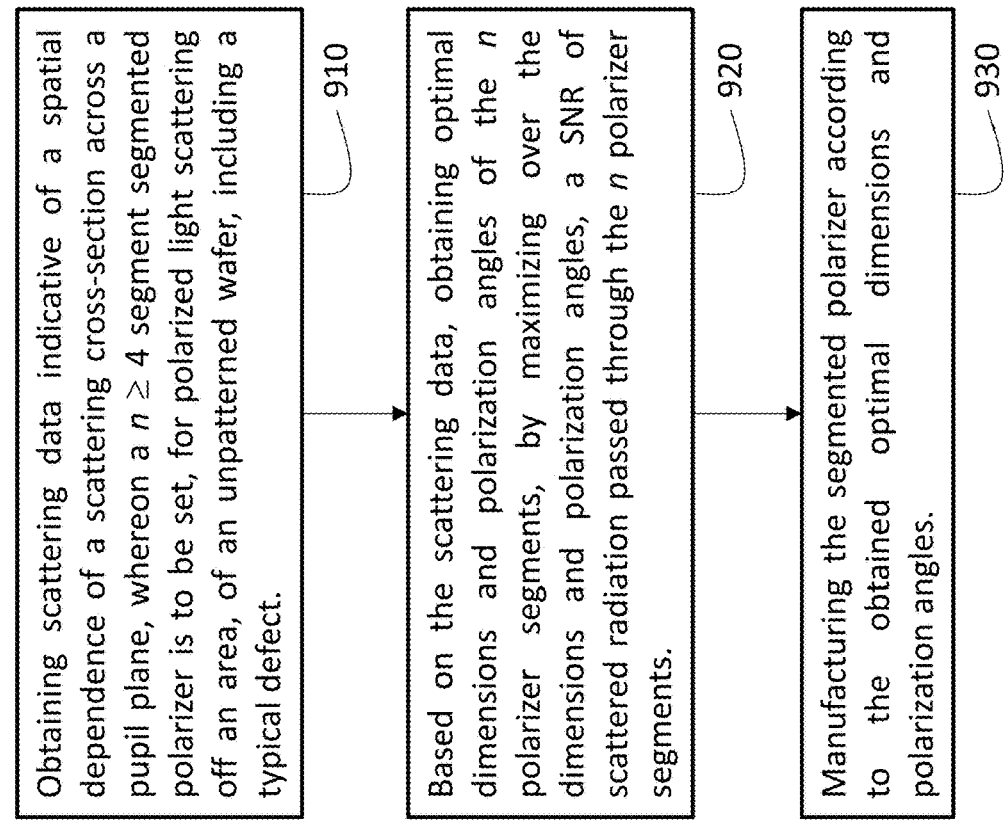
Figure 8:
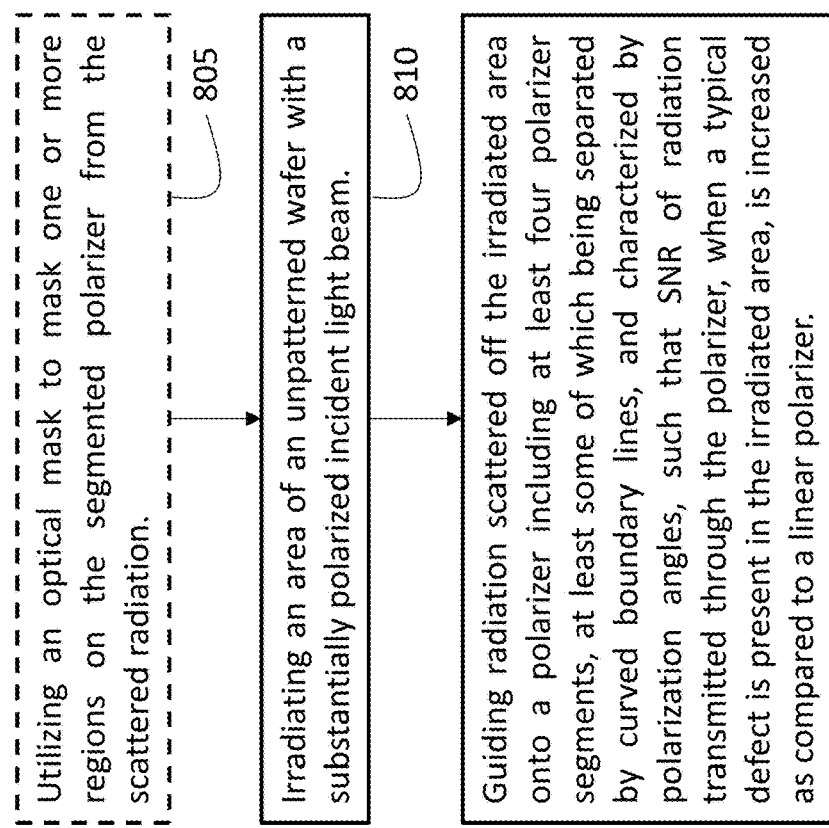
Figure 12A:
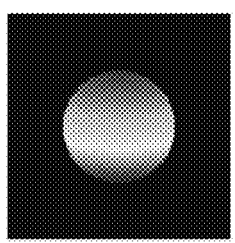
Figure 12A:
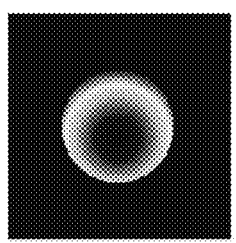
Figure 12B:
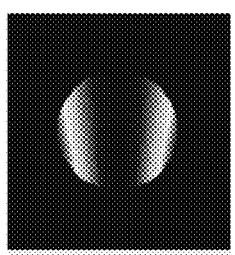
Figure 12B:
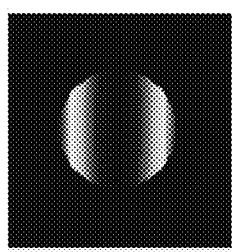
Figure 12B:
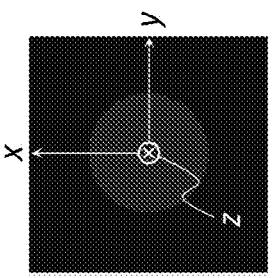
Figure 12C:
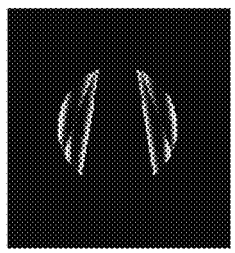
Figure 12C:
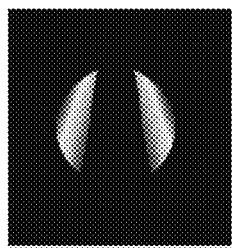
Figure 12C:
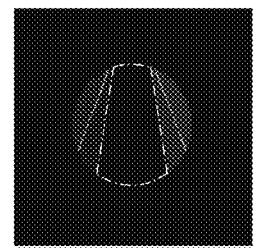
Figure 12D:
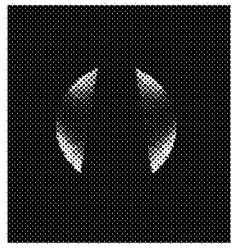
Figure 12D:
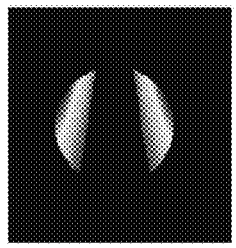
Figure 12D:
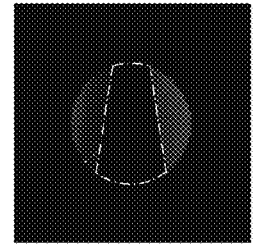
Figure 12E:
Figure 13A:
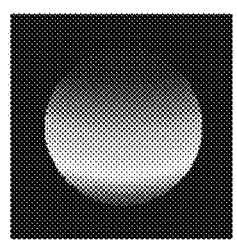
Figure 13A:
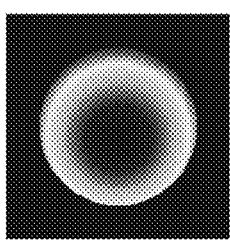
Figure 13B:
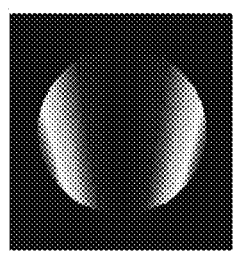
Figure 13B:
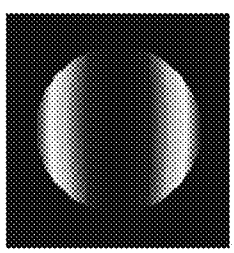
Figure 13B:
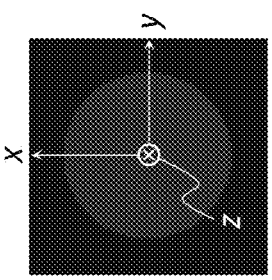
Figure 13C:
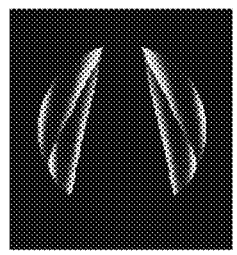
Figure 13C:
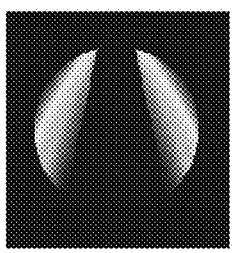
Figure 13C:
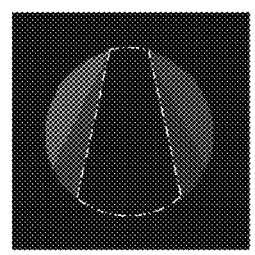
Figure 13D:
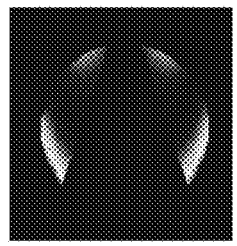
Figure 13D:
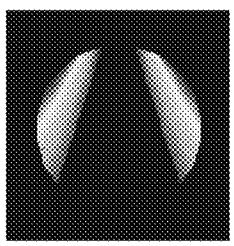
Figure 13D:
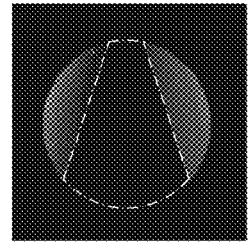
Figure 13E:
Figure 15B:
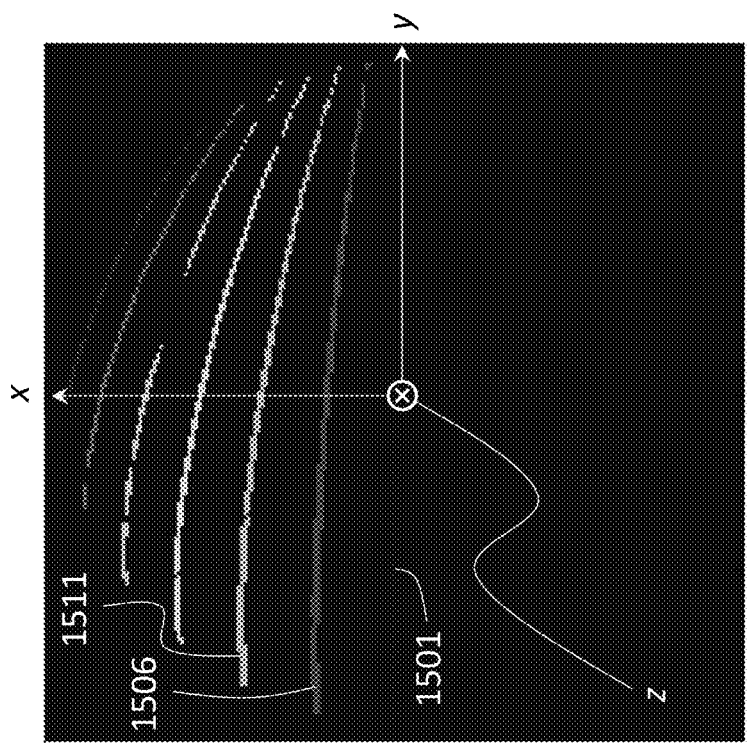
Figure 15A:
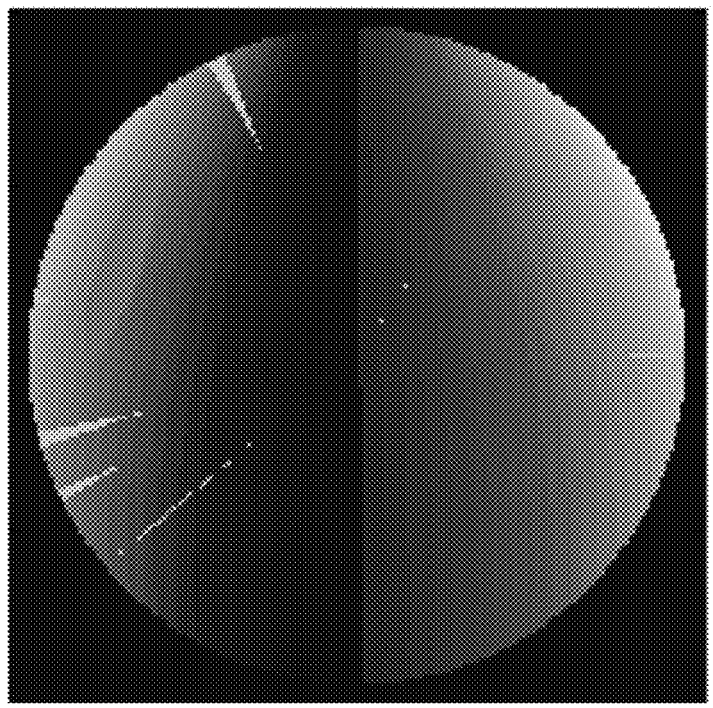
Figure 16A:
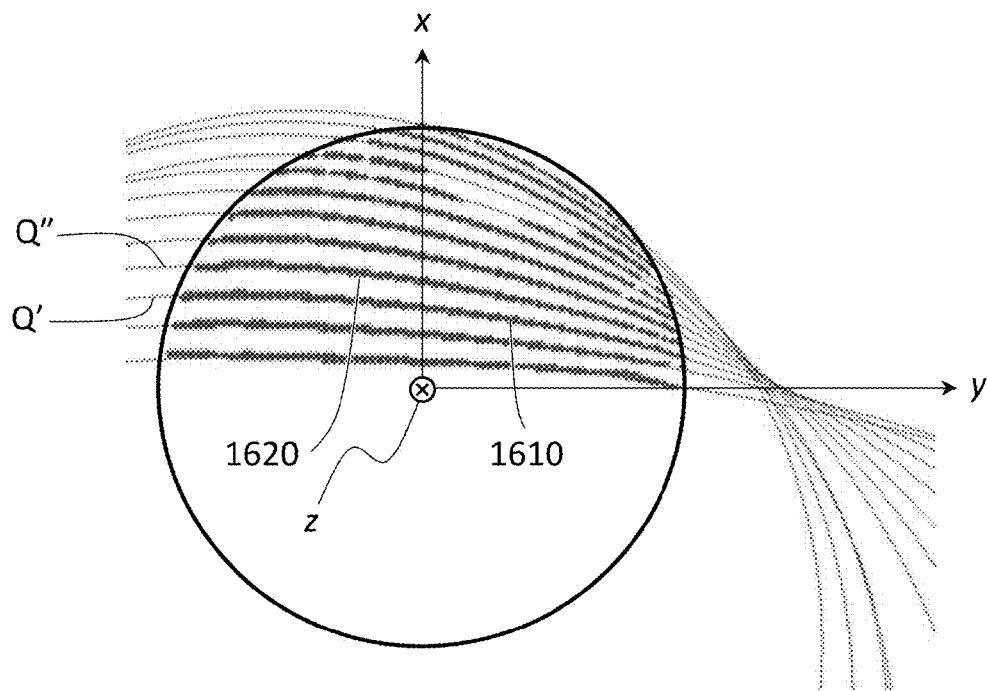
Figure 16B:
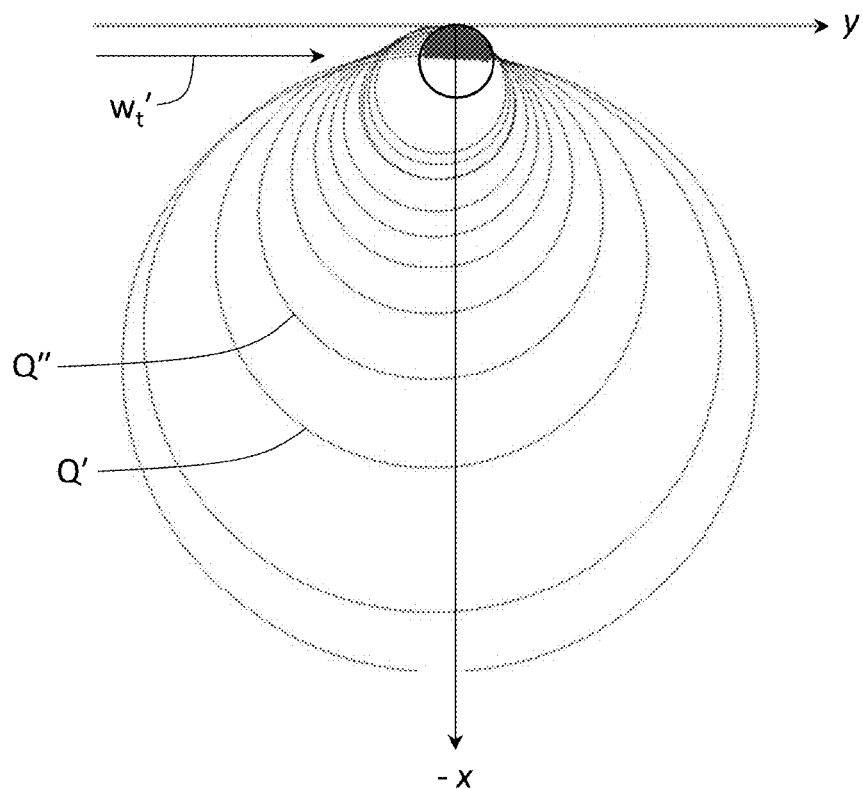

FIG. 1A schematically depicts an optical system for imaging of defects on unpatterned wafers, with an unpatterned wafer placed thereon, the system including a segmented polarizer, according to some embodiments;

FIG. 1B presents a schematic, perspective, partial view (in the sense that not all components are shown) of the system and the unpatterned wafer of FIG. 1A, according to some embodiments;

FIG. 1C schematically depicts a region on the unpatterned wafer of FIG. 1A, which is centered about an illumination area, according to some embodiments;

FIG. 2A schematically depicts a segmented polarizer, which is a specific embodiment of the segmented polarizer of FIG. 1A, and an optical mask configured for use therewith, according to some embodiments;

FIG. 2B presents a schematic bottom view of the segmented polarizer of FIG. 2A, according to some embodiments;

FIG. 2C schematically depicts the segmented polarizer of FIG. 2A and a region thereon that is "masked" by the optical mask of FIG. 2A, according to some embodiments;

FIG. 2D schematically depicts the optical mask of FIG. 2A, according to some embodiments wherein the optical mask is adjustable;

FIG. 2E schematically depicts a segmented polarizer, which is a specific embodiment of the segmented polarizer of FIG. 2A, wherein each polarizer segment is a wire-grid polarizer, according to some embodiments;

FIG. 3 schematically depicts a segmented polarizer, which is a specific embodiment of the segmented polarizer of FIG. 1A;

FIG. 4A schematically depicts a segmented polarizer, which is a specific embodiment of the segmented polarizer of FIG. 1A;

FIG. 4B schematically depicts the segmented polarizer of FIG. 4A and an optical mask configured for use therewith, according to some embodiments;

FIG. 5 schematically depicts a system for optical imaging of defects on unpatterned wafers, with an unpatterned wafer placed thereon, the system constituting a specific embodiment of the system of FIG. 1A;

FIG. 6 presents a block diagram of an optical-based system for unpatterned wafer inspection, which incorporates the optical system of FIG. 1A, according to some embodiments;

FIG. 7 presents a block diagram of an e-beam based system for reviewing defects on unpatterned wafers, which incorporates the optical system of FIG. 1A, according to some embodiments;

FIG. 8 presents a flowchart of a method for increasing signal-to-noise ratio in imaging of defects on unpatterned wafers, according to some embodiments;

FIG. 9 presents a flowchart of a method for manufacturing a segmented polarizer configured for increasing signal-to-noise ratio in imaging of defects on unpatterned wafers, according to some embodiments;

FIGS. 10A-10D present results of simulations of the system of FIG. 1A, according to some embodiments thereof; shown are polarization direction and intensity distributions, respectively—across a pupil defined by relay optics of the system—of p-polarized incident radiation scattered off an unpatterned wafer in the defect-free case and in the presence of a typical defect in the illumination area;

FIGS. 11A-11E present results of simulations of the system of FIG. 1A, according to some embodiments thereof, which are characterized by a 0.5 numerical aperture; shown are intensity distributions—across the pupil—of p-polarized incident radiation scattered off an unpatterned wafer (i) in the defect-free case, and (ii) when a typical defect is present in the illumination area, wherein the choice of polarizers varies between FIGS. 11B-11D;

FIGS. 12A-12E present results of simulations of the system of FIG. 1A, according to some embodiments thereof characterized by a 0.5 numerical aperture; shown are intensity distributions—across the pupil—of p-polarized incident radiation scattered off an unpatterned wafer (i) in the defect-free case, and (ii) when a typical defect is present in the illumination area, wherein the choice of polarizers varies between FIGS. 12B-12D and an optical mask was employed;

FIGS. 13A-13E present results of simulations of the system of FIG. 1A, according to some embodiments thereof characterized by a 0.7 numerical aperture; shown are intensity distributions—across the pupil—of p-polarized incident radiation scattered off an unpatterned wafer (i) in the defect-free case, and (ii) when a typical defect is present in the illumination area, wherein the choice of polarizers varies between FIGS. 13B-13D and an optical mask was employed;

FIGS. 14A-14E present results of simulations of the system of FIG. 1A, according to some embodiments thereof characterized by a 0.95 numerical aperture; shown are intensity distributions—across the pupil—of p-polarized incident radiation scattered off an unpatterned wafer (i) in the defect-free case, and (ii) when a typical defect is present in the illumination area, wherein the choice of polarizers varies between FIGS. 14B-14D and an optical mask was employed;

FIG. 15A present results of a simulation of the system of FIG. 1A, according to a specific embodiment thereof, wherein the segmented polarizer is semi-continuous, and characterized by a high numerical aperture; shown dimensions of polarizer segments, for which the signal-to-noise ratio of the scattered radiation filtered through the segmented polarizer—when a typical defect is present in the illumination area—is maximized;

FIG. 15B show boundary lines between adjacent polarizer segments in a top half of the segmented polarizer of FIG. 15A; and FIGS. 16A and 16B show arcs of circles and corresponding circles, respectively, each of which has been fitted onto a respective boundary line in the top half of the segmented polarizer of FIG. 15A.

DETAILED DESCRIPTION OF THE INVENTION

The principles, uses, and implementations of the teachings herein may be better understood with reference to the accompanying description and figures. Upon perusal of the description and figures present herein, one skilled in the art will be able to implement the teachings herein without undue effort or experimentation. In the figures, same reference numerals refer to same parts throughout.

In the description and claims of the application, the words "include" and "have", and forms thereof, are not limited to members in a list with which the words may be associated.

As used herein, the term "about" may be used to specify a value of a quantity or parameter (e.g. the length of an element) to within a continuous range of values in the neighborhood of (and including) a given (stated) value. According to some embodiments, "about" may specify the value of a parameter to be between 80% and 120% of the given value. For example, the statement "the length of the element is equal to about 1 m" is equivalent to the statement "the length of the element is between 0.8 m and 1.2 m". According to some embodiments, "about" may specify the value of a parameter to be between 90% and 110% of the given value. According to some embodiments, "about" may specify the value of a parameter to be between 95% and 105% of the given value.

As used herein, according to some embodiments, the terms "substantially" and "about" may be interchangeable.

As used herein, a first function $f(x)$ may be said to be "substantially equal" to a second function $g(x)$ when $0.8 \cdot f(x) \le g(x) \le 1.2 \cdot f(x)$, $0.9 \cdot f(x) \le g(x) \le 1.1 \cdot f(x)$, or $0.95 \cdot f(x) \le g(x) \le 1.05 \cdot f(x)$, for at least 80%, at least 90%, or at least 95% of a range (particularly a continuous range) of values assumable by x. Each possibility corresponds to separate embodiments. Similarly, a first multi-variable function $f(x_1, x_2, \ldots, x_n)$ may be said to be "substantially equal" to a second multi-variable function $g(x_1, x_2, \ldots, x_n)$ when $0.8 \cdot f(x_1, x_2, \ldots, x_n) \leq g(x_1, x_2, \ldots, x_n) \leq 1.2 \cdot f(x_1, x_2, \ldots, x_n)$, $0.9 \cdot f(x_1, x_2, \ldots, x_n) \leq g(x_1, x_2, \ldots, x_n) \leq 1.1 \cdot f(x_1, x_2, \ldots, x_n)$, or $0.95 \cdot f(x_1, x_2, \ldots, x_n) \leq g(x_1, x_2, \ldots, x_n) \leq 1.05 \cdot f(x_1, x_2, \ldots, x_n)$, for at least 80%, at least 90%, or at least 95% of each of n continuous ranges of values assumable by $x_1$ to $x_n$, respectively. In particular, "substantial equality" also covers "equality". Each possibility corresponds to separate embodiments.

Further, as used herein, a statement that a parameter or quantity "substantially exhibits" or "substantially follows" a specific type of behavior—that is, a certain form of mathematical dependence (e.g. linear dependence) on one or more variables (i.e. one or more other parameters or quantities)—is to be understood as meaning that the behavior of the parameter or quantity may be described by a first function that is substantially equal to a second function that exhibits the specific type of behavior. Thus, for example, a pair of two-dimensional curves may be "substantially equal" when a first function, describing a first of the two curves, is substantially equal to a second function, describing the second of the two curves. In particular, a line composed of, or including, a plurality of straight line segments—such that adjacent straight line segments define obtuse angles, respectively, there between—may be "substantially equal" to a curved line. Consequently, according to some embodiments, a line composed of, or including, a plurality of straight line segments may be "substantially curved".

As used herein, the term "substantially" may be used to specify that a first property, quantity, or parameter is close or equal to a second or a target property, quantity, or parameter. For example, a first element and a second element may be said to have "substantially the same shape and dimensions", when a first volume (or first area), defined by the first element, may be at least 80% (or some other pre-defined threshold percentage) occupied by the second element (e.g. after moving the first element), and a second volume (or second area), defined by the second element, may be at least 80% occupied by the first element (e.g. after moving the second element). Put differently, a maximum overlap between a first shape, mathematically parametrizing the first element, and a second shape, mathematically parametrizing the second element, is at least 80%. In particular, the case wherein the first element is of the same shape and dimensions as the second element is also encompassed by the statement that the first element and the second element are of "substantially the same shape and dimensions".

According to some embodiments, the target quantity (e.g. signal-to-noise ration of radiation passed through a polarizer) may refer to an optimal parameter, which may in principle be obtainable using mathematical optimization software. Accordingly, a value assumed by a parameter may be said to be "substantially equal" to the maximum possible value assumable by the parameter, when the value of the parameter is equal to at least 80% (or some other pre-defined threshold percentage) of the maximum possible value (that is, the value of the parameter may be smaller than the maximum possible value by no more than 20% of the maximum possible value). In particular, the case wherein the value of the parameter is equal to the maximum possible value is also encompassed by the statement that the value assumed by the parameter is "substantially equal" to the maximum possible value assumable by the parameter. Referring to the figures, in flowcharts and block diagrams, optional operations and elements/components may appear within boxes delineated by a dashed line.

The terms "top" and "bottom", when used to refer to elements in figures, are to be understood relative to the page, as held by a reader perusing the figures.

The relative terms "left" and "right", when used to refer to elements in figures, are to be understood as in everyday usage, wherein, for example, the first letter of a word (in English) will be understood to be located closer to the left edge of a page than the second letter in the word, and so on. Thus, a first element in a figure may be said to be positioned to the "left" of a second element in the figure, when positioned closer to the left edge of the page than the second element.

Similarly, the relative terms "above" and "below", when used to refer to elements in figures—for example, when a first element is said to be positioned "above" a second element—are to be understood as in everyday usage, so that the first element will be located closer to the top of the page than the second element.

For ease of description, in some of the figures a three-dimensional cartesian coordinate system (with orthogonal axes x, y, and z) is introduced. It is noted that the orientation of the coordinate system relative to a depicted object may vary from one figure to another. Further, the symbol ⊙ may be used to represent an axis pointing "out of the page", while the symbol ⊗ may be used to represent an axis pointing "into the page".

Introduction

Aspects of the disclosure, according to some embodiments, are directed at signal-to-noise ratio (SNR) amplification in optical imaging of defects on unpatterned (blanket) wafers, both in the context of (optical) inspection of unpatterned wafers and in the context of defect map correction in electron-beam (e-beam) based (unpatterned wafer) defect review. To this end, the disclosed systems and methods exploit the change to the scattering cross-section of polarized light, incident on an unpatterned wafer, due to the presence of a typical (three-dimensional) defect (e.g. shaped as a sphere) in an illuminated region (area) on the unpatterned wafer.

The present application, according to some embodiments, discloses a segmented polarizer, wherein different polarizer segments are characterized by different polarization angles. The polarization angle of the transmission axis of each polarizer segment may be selected to substantially maximize the SNR of returned radiation, associated with a typical defect, arriving at the polarizer segment. Further, the dimensions (sizes and shapes) of the polarizer segments may be similarly optimized, resulting in polarizer segments, assuming curved contours, as described below. The spatial dependence of the polarization cross-section (across the pupil plane) is thus addressed on a segment-by-segment basis. This leads to a significant increase in the signal-to-noise ratio (SNR) when a defect is present, and allows for considerably improved discrimination of defect signatures (radiation signals) from pure background noise.

Advantageously, according to some embodiments, the segmented polarizer may include dozens (e.g. fifty, a hundred, or even more) polarizer segments (e.g. in the form of strips), wherein polarization angles of adjacent polarizer segments may vary effectively continuously. That is, in such embodiments, the segmented polarizer effectively functions as a continuous polarizer, with the polarization angle changing effectively continuously as a function of the location on the polarizer.

Simulations suggest that, optimally, boundary lines separating adjacent polarizer segments substantially curve outwards from a plane that is perpendicular to the segmented polarizer and bisects the segmented polarizer into two symmetric parts. More specifically, each boundary line, unless on the perpendicular plane, curves away both from a respective chord, on which the boundary line is suspended, and from the perpendicular plane, in the sense that the boundary line does not extend between the chord and perpendicular plane. Maximizing the SNR and minimizing background noise radiation thus seem to constitute two different tasks necessitating the use of different segmented polarizers, respectively. More specifically, when a linearly polarized light beam is incident on a defect-free nanorough surface (such as the surface of an unpatterned wafer), the (collected) polarization cross-section exhibits substantially uniform linear polarization over sizeable solid angles. Therefore, to minimize background noise radiation it seems that a segmented polarizer, characterized by straight—rather than curved—boundary lines, should be utilized.

As used here, the terms "p-polarization" and "transverse magnetic (TM) polarization" are used interchangeably. Similarly, the terms "s-polarization" and "transverse electric (TE) polarization" are used interchangeably.

As used herein, according to some embodiments, the terms "polarization angle" and "polarization direction" may be used interchangeably. In particular, according to some embodiments, the terms "polarization angle" and "polarization direction", when used in reference to a polarizer (e.g. polarizing filter), will be understood to refer to the orientation of the transmission axis of the polarizer.

As used herein, according to some embodiments, the term "substantially polarized light" covers both partially polarized light with a degree of polarization $\wp$ greater than (or equal to) 0.8, as well as purely polarized light (i.e. $\wp=1$). $\wp = \sqrt{S_1^2 + S_2^2 + S_3^2}/S_0$, wherein $S_0$, $S_1$, $S_2$, and $S_3$ are the Stokes parameters characterizing the polarization of the light.

As used herein, according to some embodiments, the terms light, "light beam", and "radiation" may be used interchangeably. Similarly, according to some embodiments, the verbs "to illuminate" and "to irradiate", and derivatives thereof, may be used interchangeably.

As used herein, the term "scattering" with reference to light returned from a surface illuminated by a light beam, excludes (specular) reflection.

As used herein, the terms "unpatterned wafer" and "blanket wafer" are used interchangeably.

As used herein, according to some embodiments, a segmented polarizer may be said to be "semi-continuous" when including at least twenty segments.

As used herein, the term "polarizer segment" refers to a portion of a segmented polarizer, such that the portion is itself a polarizer. More specifically, a portion (of a segmented polarizer), whether opaque or transparent, and which, in particular, does not selectively filter light based on polarization, will not be referred to herein as a "polarizer segment".

As used herein, according to some embodiments, the term "typical defect" may refer to a three-dimensional defect that has an average shape (e.g. spherical), and optionally size and scattering properties (which may be dependent on the material composition of the defect), which are characteristic of defects on unpatterned wafers or a specific type of unpatterned wafer, for example, unpatterned wafers manufactured by the same machinery, to the same specification, and so on. The average shape and size may be obtained, for example, by imaging a large number of defects on an unpatterned wafer(s), obtaining parameters mathematically parameterizing the shape, and optionally the size, of each the imaged defects, and averaging over the parameters.

Systems

According to an aspect of some embodiments, there is provided a system for optical imaging of defects on unpatterned wafers. FIG. 1A schematically depicts such a system, a system 100, according to some embodiments. System 100 includes an illumination module 102, relay optics 106 including at least an objective lens 108, a segmented polarizer 112, and a detector 116. According to some embodiments, and as depicted in FIG. 1A, system 100 may also include a stage 118 for placement thereon of an (unpatterned) wafer, such as an unpatterned wafer 120, which is to be imaged. Optionally, system 100 may further include additional optics (not shown), such as, for example, a tube lens for focusing light passed through (i.e. transmitted through) segmented polarizer 112 onto detector 116.

Illumination module 102 may be configured to generate an incident light beam $L_I$ directed at an (upper surface of) unpatterned wafer 120 at an incidence angle $\theta_I$. The incident light beam may define an illumination area 123 on unpatterned wafer 120. The incident light beam may be polarized, for example, linearly polarized or elliptically polarized. According to some embodiments, the incident light beam may be a laser beam. According to some embodiments, the polarization of the incident light beam may be controllably selected (e.g. to be p-polarized, s-polarized, linearly polarized at an acute angle relative to the incidence plane, circularly polarized, and so on). A reflected light beam $L_R$ represents a part of the returned light, which is specularly reflected, and therefore returned at a reflection angle $\theta_R = \theta_I$.

According to some embodiments, such as embodiments wherein detector 116 is a camera, illumination area 123 may correspond to a region (of unpatterned wafer 120), which has every sub-region thereof simultaneously irradiated by the incident light beam $L_I$. According to some alternative embodiments, wherein illumination module 102 is configured to generate a "flying spot", illumination area 123 may correspond to a region (of unpatterned wafer 120), whose sub-regions are successively irradiated by the incident light beam $L_I$. In such embodiments, light scattered off each sub-region is sensed at non-overlapping (non-coincident) time intervals by detector 116. In particular, the scope of the disclosure will be understood to cover both of these options.

Objective lens 108 may be positioned such that at least a portion of the scattered radiation (e.g. diffusely scattered light) arrives thereat. Objective lens 108 is configured to focus the scattered radiation arriving thereat, such as to form (optionally, together with additional optical components (not shown), e.g. lenses, which may be included in relay optics 106) a collimated light beam directed onto segmented polarizer 112. Segmented polarizer 112 includes a plurality of polarizer segments (such as polarizer segments 132, depicted in FIG. 1B). According to some embodiments, segmented polarizer 112 includes at least three polarizer segments, and, preferably, four or more polarizer segments. Each of the polarizer segments may be characterized by a different polarization angle, as elaborated on below. Light filtered through segmented polarizer 112 is directed, optionally utilizing additional optics (not shown), onto detector 116. Detector 116 is configured to sense the light filtered through segmented polarizer 112, thereby allowing to produce an image of illumination area 123.

Also indicated in FIG. 1A is an optical axis A defined by relay optics 106. According to some embodiments, the optical axis A and the incident light beam $L_I$ span a non-zero angle therebetween, such that the returned light beam $L_R$ is not collected by relay optics 106. According to some embodiments, the incident light beam $L_I$ is obliquely directed onto unpatterned wafer 120: A tangential component $w_t$ of a wavevector of the incident light beam $L_I$ is parallel to unpatterned wafer 120 and points in the direction defined by the positive y-axis. A normal component $w_n$ of the wavevector of the incident light beam $L_I$ is perpendicular to unpatterned wafer 120 and points in the direction defined by the negative z-axis. According to some embodiments, and as depicted in FIG. 1A, the optical axis A is perpendicular to unpatterned wafer 120 (and $\theta_I > 0°$).

According to some alternative embodiments, not depicted in FIG. 1A, the incident light beam $L_I$ may be perpendicular to unpatterned wafer 120 (i.e. $\theta_I = 0°$) and the optical axis A may define an acute angle (smaller than 90°) with respect to unpatterned wafer 120. According to some embodiments, not depicted in FIG. 1A, each of the incident light beam $L_I$ and the optical axis A defines a respective acute angle with respect to unpatterned wafer 120.

According to some embodiments, and as depicted in FIG. 1A, objective lens 108 is positioned and oriented such that the scattered radiation arriving thereat forms a cone C of light scattered off unpatterned wafer 120 at a range of (polar) scattering angles between 0° and $\theta_M$. According to some embodiments, the cone C does not include the reflected light beam $L_R$. According to some such embodiments, and as depicted in the figures, $\theta_M < \theta_R$, thereby ensuring that the cone C does not include the reflected light beam $L_R$.

According to some embodiments, system 100 may further include an optical mask 124. Optical mask 124 may be positioned below segmented polarizer 112, i.e. between relay optics 106 and segmented polarizer 112. According to some embodiments, optical mask 124 may be positioned adjacently to segmented polarizer 112. According to some alternative embodiments, optical mask 124 may be positioned above segmented polarizer 112 (e.g. adjacently thereto).

Optical mask 124 is configured to block one or more portions of the collimated light beam exiting relay optics 106. Consequently, one or more corresponding regions of segmented polarizer 112 are substantially not illuminated by the collimated light beam.

According to some embodiments, system 100 may further include a waveplate 126 (i.e. a retarder plate). Waveplate 126 may be positioned between relay optics 106 and segmented polarizer 112. According to some embodiments, optical mask 124 may be positioned adjacently to segmented polarizer 112 (between relay optics 106 and segmented polarizer 112). According to some embodiments, wherein system 100 further includes optical mask 124, waveplate 126 may be positioned adjacently to optical mask 124 from above or below (i.e. between relays optics 106 and optical mask 124 or between optical mask 124 and segmented polarizer 112). The function of waveplate 126 is explained below.

According to some embodiments, and as elaborated on below, optical mask 124 may be controllably adjustable, such to as to allow changing a size, shape, position, and/or orientation thereof. This in turn allows to control the size and/or shape of a region(s) of segmented polarizer 112, which is to be "masked" (i.e. blocked) from the collimated light beam.

As used herein, the term "optical mask" may be used in a broad sense to refer to any optical element or means, which when illuminated with a light beam, blocks one or more portions of the light beam. The blocking may be implemented, for example, by one or more corresponding light-reflecting or light-absorbing portions of the optical element.

According to some embodiments, optical mask 124 may be integrated with segmented polarizer 112. For example, optical mask 124 may be adhered onto segmented polarizer 112. According to some embodiments, optical mask 124 may constitute a coating on segmented polarizer 112, such as an opaque layer of reflecting or absorbing material.

According to some embodiments, the polarizer segments of segmented polarizer 112 may be non-complementary in the sense of not fully encompassing segmented polarizer 112. That is, in such embodiments, the polarizer segments do not constitute all of segmented polarizer 112. According to some such embodiments, one or more sections of segmented polarizer 112, which are distinct from the polarizer segments, may be made of an opaque material (in the sense of not passing any light therethrough irrespective of the polarization of the light).

Segmented polarizer 112 may be substantially set on a pupil plane O defined by relay optics 106. According to some embodiments, objective lens 108 may be oriented in parallel to unpatterned wafer 120. More generally, relay optics 106 may be configured such that the optical axis A defined thereby (and, in particular, an optical axis of objective lens 108) is perpendicular to unpatterned wafer 120. According to some embodiments, segmented polarizer 112, and, optionally, optical mask 124, may be oriented in parallel to unpatterned wafer 120 (with segmented polarizer 112 being substantially set on the pupil plane O).

According to some embodiments, system 100 may be configured such that an incidence plane M (indicated in FIG. 1B), defined by the incident light beam $L_I$, bisects (i.e. cuts into two equals halves) objective lens 108. According to some embodiments, system 100 may be configured such that the incidence plane bisects segmented polarizer 112 (in such embodiments the incidence plane coincides with the perpendicular plane defined above), and, optionally, optical mask 124. More specifically, according to some embodiments, particularly wherein illumination module 102 is configured to produce p-polarized light, segmented polarizer 112 may be configured accordingly by exhibiting mirror symmetry about the perpendicular plane (and the incidence plane in embodiments wherein the incidence plane coincides with the perpendicular plane). That is, the spatial distribution of polarization angles, characterizing the polarizer segments, may exhibit mirror symmetry about the perpendicular plane. According to some embodiments, optical mask 124 and/or waveplate 126 may also exhibit mirror symmetry about the perpendicular plane. According to some embodiments, system 100 may be configured such that illumination area 123 (defined by the incident light beam $L_I$) is centered about the optical axis A. It is noted that in such embodiments, and as depicted in FIG. 1A, the cone C (whose tip is substantially positioned on illumination area 123) is also centered about the optical axis A.

Four scattered light rays, $R_A$, $R_B$, $R_C$, and $R_D$, which are scattered along the incidence plane M, are depicted in FIG. 1A. The light rays $R_A$ and $R_D$ are each scattered at the polar angle $\theta_M$, but at azimuth angles of 270° (in other words, −90°) and 90°, respectively. (The azimuth angle is defined in FIG. 1A as ranging counter-clockwise, from the positive x-axis, which is perpendicular to the incidence plane M.) The light rays $R_A$ and $R_D$ thus each lie on the surface of the cone C. The light rays $R_B$ and $R_C$ are each scattered at a polar angle $\theta_S < \theta_M$, but at azimuth angles of 270° and 90°, respectively. Light rays $R_B$ and $R_C$ thus each lie within the cone C.

The light rays $R_A'$, $R_B'$, $R_C'$, and $R_D'$ correspond to the light rays $R_A$, $R_B$, $R_C$, and $R_D$, respectively, after being refracted by objective lens 108. The light rays $T_A$, $T_B$, $T_C$, and $T_D$ correspond to the light rays $R_A'$, $R_B'$, $R_C'$, and $R_D'$, respectively, after being filtered through segmented polarizer 112 (and, optical mask 124, when present). According to some embodiments, the intensity of the light rays $T_A$, $T_B$, $T_C$, and $T_D$—particularly since each of the depicted light rays scatters along the incidence plane—substantially vanishes. In FIG. 1A, each of the light rays $T_A$, $T_B$, $T_C$, and $T_D$ is indicated by a dashed line to indicate that, in some embodiments, the light ray may not be present, i.e. when the corresponding light ray exiting objective lens 108 is fully filtered out by segmented polarizer 112, and/or fully blocked by optical mask 124, when present.

According to some embodiments, stage 118 may be moveable and/or rotatable, such as to allow moving and/or rotating unpatterned wafer 120 and scanning or reviewing different regions thereof, as known in the art of wafer analysis. In particular, this allows for implementing the configurations described above (e.g. the mirror symmetry of segmented polarizer 112 with respect to the incidence plane, the centering of objective lens 108 with respect to illumination area 123) when scanning or reviewing different regions of unpatterned wafer 120.

Referring also to FIG. 1B, FIG. 1B is a schematic, perspective view depicting some of the components of system 100, according to some embodiments. Shown are objective lens 108 and segmented polarizer 112. Also shown is unpatterned wafer 120. Three light rays, each returned at the (polar) scattering angle $\theta_M$ are indicated: a first scattered light ray $R_1$, a second scattered light ray $R_2$, and a third scattered light ray $R_3$. It is noted that the surface of the cone C, which is scattered onto objective lens 108, is formed by all of the light rays that are returned at the scattering angle $\theta_M$. The light rays $R_1$, $R_2$, and $R_3$ are also indicated in FIG. 1C, which provides an enlarged view of illumination area 123. Further indicated is an angle $\zeta$ on the xy-plane. $\zeta = 360° - \varphi_2$, wherein $\varphi_2$ is the azimuth angle at which the second light ray $R_2$ is scattered.

It is noted that in FIG. 1B, the choice of coordinate system is such that the yz-plane coincides with the incidence plane M and the z-axis coincides with the optical axis A.

According to some embodiments, segmented polarizer 112 may be shaped as a disc or light polarizing regions thereof may define a disc. According to some embodiments, the disc may be elongated. As used herein, according to some embodiments, the terms "disc" and "cylinder" may be used interchangeably when the disc is elongated.

According to some embodiments, segmented polarizer 112 may be configured to be utilized in conjunction with a particular preparation polarization (i.e. the polarization of the incident light beam $L_I$), such as, for example, p-polarization, s-polarization, or even an intermediate linear polarization between p-polarization and s-polarization. The choice of incident polarization may be dependent on the context. Incident p-polarization may be more useful for detecting small defects, as typically the defect will scatter more (and accordingly reflect less) of incident p-polarization as compared to incident s-polarization. Incident s-polarization may be more useful for comparatively high-roughness surfaces (and, consequently, larger defects).

By stating that segmented polarizer 112 is configured to be utilized in conjunction with a particular preparation polarization, what is meant is that for the particular preparation polarization, performance of system 100, according to some target measure (e.g. maximum amplification of the SNR associated with a typical defect), is substantially optimized. A particular preparation polarization, to which segmented polarizer 112 is suited (in the sense of being configured to be utilized therewith), will be referred to as a "suitable preparation polarization". According to some embodiments, for the suitable polarization preparation, the polarization angles of the polarizer segments are such that respective SNRs of scattered light, passed through each of the polarizer segments, respectively, are substantially maximized for a typical-defect radiation signal (i.e. when illumination area 123 includes a typical defect).

More generally, according to some embodiments. the polarization angles and dimensions of each of the polarizer segments are such that for the suitable polarization preparation, the SNR of scattered light, passed through segmented polarizer 112, is substantially maximized when the illumination area includes a typical (e.g. a ball-shaped) defect. In particular, according to some embodiments, boundary lines between adjacent polarizer segments (of segmented polarizer 112) may be curved, essentially as described in the description of FIGS. 2A, 2B, 3, and 4A and in the Results of Simulations subsection.

According to some embodiments, wherein polarizer segments 132 include adjacent segments, the polarization angles of adjacent segments differ by no more than about 15°, about 10°, about 8°, about 6°, about 5°, about 4°, about 3°, about 2°, about 1°, or even less. Each possibility corresponds to separate embodiments. Generally, the greater the number of polarizer segments, the smaller the difference between polarization angles of adjacent segments.

According to some embodiments, segmented polarizer 112 is a wire-grid polarizer (WGP). More specifically, according to some embodiments, each of polarizer segments 132 is a WGP configured to pass through the polarizer segment light at a respective polarization direction.

According to some embodiments, the polarization directions of polarizer segments 132 may be such that for each polarizer segment, the SNR of radiation, passed through the polarizer segment, is substantially maximized for a typical-defect radiation signal.

According to some embodiments, the dimensions and polarization angles of each of polarizer segments 132, and the dimensions of optical mask 124 (and/or any opaque sections of segmented polarizer 112, if present) and the positioning thereof relative to segmented polarizer 112 (and/or the positioning of the opaque sections, if present), are such that for the suitable polarization preparation, the SNR of radiation passed through segmented polarizer 112 is substantially maximized for a typical-defect radiation signal.

According to some embodiments, such as embodiments wherein the incident light beam $L_I$ is linearly polarized, some of the incident radiation scattered off unpatterned wafer 120 may be elliptical or slightly elliptical. This may hold both when the scattered radiation corresponds to pure background noise and when the scattered radiation corresponds to a typical-defect radiation signal. According to some such embodiments, waveplate 126 may be utilized to substantially "linearize" the elliptical radiation arriving thereat, and thereby ensure that linearly polarized radiation arrives at segmented polarizer 112.

As the degree of ellipticity of the collimated light beam, exiting relay optics 106, may vary in the lateral direction (i.e. along a plane perpendicular to the optical axis A), waveplate 126 may be segmented. The segmentation may be such that each waveplate segment of waveplate 126 is configured to modify by a different amount (i.e. to a different extent), respectively, the phase between the horizontal and vertical polarization components of the respective radiation arriving at the waveplate segment. The position-dependent modification of the phase may be such that the light exiting each waveplate segment is substantially linearly polarized.

According to some embodiments, the segmentation of waveplate 126 may correspond to that of segmented polarizer 112. In particular, the dimensions of the waveplate segments may match the dimensions of polarizer segments 132. According to some embodiments, contours (e.g. boundary lines) of at least some of the waveplate segments may be curved. According to some embodiments, each waveplate segment may be positioned substantially adjacently (from below) to a respective polarizer segment. According to some embodiments, wherein optical mask 124 is included, optical mask 124 may be sandwiched between waveplate 126 and segmented polarizer 112, or waveplate 126 may be sandwiched between optical mask 124 and segmented polarizer 112.

According to some embodiments, system 100 may be configured such as to allow optimizing over the incidence angle and/or the frequency of the incident light beam, thereby potentially further increasing the SNR.

FIG. 2A presents a schematic, perspective bottom-view of a segmented polarizer 212, according to some embodiments. Segmented polarizer 212 is a specific embodiments of segmented polarizer 112. As a non-limiting example, intended to facilitate the description, segmented polarizer 212 is assumed to include five polarizer segments 232: a central segment 232a, a first side segment 232b, a second side segment 232c, a third side segment 232d, and a fourth side segment 232e. According to some embodiments, and as depicted in FIG. 2A, polarizer segments 232 may be complementary in the sense of fully encompassing segmented polarizer 212 (i.e. the sum of areas of polarizer segments 232 equals the area of segmented polarizer 212). Central segment 232a is positioned between first side segment 232b and third side segment 232d. First side segment 232b is positioned between second side segment 232c and central segment 232a. Third side segment 232d is positioned between central segment 232a and fourth side segment 232e.

FIG. 2B presents a schematic bottom view of segmented polarizer 212, according to some embodiments.

To further facilitate the description and render it more concrete, it is assumed that segmented polarizer 212 is configured to substantially maximize SNR of radiation transmitted therethrough due to the scattering of a p-polarized (incident) light beam off an unpatterned wafer. In particular, in embodiments of system 100 including segmented polarizer 212, illumination module 102 is configured to produce (or allow producing) a p-polarized incident light beam.

Accordingly, and taking into account that, as mentioned in the Introduction, for incident p-polarization the scattering cross-section is symmetric about the incidence plane, central segment 232a may be symmetric about the yz-plane (also referred to as the "perpendicular plane"). According to some embodiments, and as depicted in FIG. 2A, the system may be configured such that an incidence plane, defined by the incident light beam, coincides with the perpendicular plane, so that the incidence plane may bisect central segment 232a. Central segment 232a may be characterized by a polarization direction of ($\theta=90°$, $\varphi=0°$), wherein the first entry in the brackets denotes the polar angle, as measured from the positive z-axis, and the second entry in the brackets denotes the azimuth angle. That is, central segment 232a may be configured to filter therethrough light that is linearly polarized in parallel to the x-axis. The polarization direction is visualized in FIG. 2A by (double-headed) arrows $P_A$, which lie on the pupil plane in parallel to the x-axis. (It is to be understood that the lengths of the polarization arrows are not meant to signify anything.) Thus, along they-axis, central segment 232a may be configured to fully filter out they-component of the scattered radiation arriving thereat (i.e. light scattered along the incidence plane).

First side segment 232b and third side segment 232d may display mirror symmetry about the incidence plane. First side segment 232b may be characterized by a polarization direction of ($\theta=90°$, $\varphi=\kappa>0°$). (Here, the angle $\varphi$ is defined as ranging clockwise from the positive x-axis to the positive y-axis.) Third side segment 232d may be characterized by a polarization direction of ($\theta=90°$, $\varphi=-\kappa$), or, more precisely, and what amounts to the same thing ($\theta=90°$, $\varphi=360°-\kappa$). The respective polarization directions, characterizing first side segment 232b and third side segment 232d, are visualized in FIG. 2A by (double-headed) arrows $P_B$ and $P_D$, respectively, which lie on the pupil plane. Both the double-headed arrow $P_B$ and the x-axis, and the double-headed arrow $P_D$ and the x-axis, respectively, subtend there between an angle $\xi$ whose magnitude equals $\kappa$.

Second side segment 232c and fourth side segment 232e may display mirror symmetry about the incidence plane. Second side segment 232c may be characterized by a polarization direction of ($\theta=90°$, $\varphi=\lambda>\kappa>0°$), and fourth side segment 232e may be characterized by a polarization direction of ($\theta=90°$, $\varphi=-\lambda$). The respective polarization directions, characterizing second side segment 232c and fourth side segment 232e, are visualized in FIG. 2A by (double-headed) arrows $P_C$ and $P_E$, respectively, which lie on the pupil plane.

According to some embodiments, each of side segments 232b, 232c, 232d, and 232e is substantially shaped as a curved strip. More specifically, each of polarizer segments 232a, 232b, and 232d is positioned between two respective boundary lines and respective arcs (on the circumference of segmented polarizer 212) extending between the boundary lines. Referring to FIG. 2B, four boundary lines are indicated: A first boundary line 201 separates central segment 232a from first side segment 232b. A second boundary line 203 separates first side segment 232b from second side segment 232c. A third boundary line 207 separates central segment 232a from third side segment 232d. A fourth boundary line 209 separates third side segment 232d from fourth side segment 232e. According to some embodiments, and as depicted in FIGS. 2A and 2B, boundary lines 201, 203, 207, and 209 are curved, as described in detail below.

(It is noted that since segmented polarizer 212 has thickness, the boundaries separating adjacent polarizer segments have slightly extend along the z-dimension. Each of boundary lines 201, 203, 207, and 209 thus indicates a two-dimensional band with a width equal to the thickness of segmented polarizer 212.)

Central segment 232a is delimited by first boundary line 201 and third boundary line 207, and a left arc (not numbered) and a right arc (not numbered) extending between first boundary line 201 and third boundary line 207, such as to fully circumscribe central segment 232a. According to some embodiments, first boundary line 201 and third boundary line 207 are symmetrically disposed (relative to one another) about the y-axis, thereby rendering the central segment 232a mirror-symmetric about the yz-plane.

First side segment 232b is delimited by second boundary line 203 and first boundary line 201, and a left arc (not numbered) and a right arc (not numbered) extending between second boundary line 203 and first boundary line 201, such as to fully circumscribe first side segment 232*b*. Third side segment 232*d* extends between third boundary line 207 and fourth boundary line 209, and a left arc (not numbered) and a right arc (not numbered) extending between third boundary line 207 and fourth boundary line 209, such as to fully circumscribe third side segment 232*d*. According to some embodiments, in addition to first boundary line 201 and third boundary line 207 being symmetrically disposed about the y-axis, third boundary line 207 and fourth boundary line 209 are also symmetrically disposed relative to one another about the y-axis. Accordingly, first side segment 232*b* and third side segment 232*d* are symmetrically disposed relative to one another about the yz-plane (i.e. constituting mirror images of one another).

Second side segment 232*c* extends between second boundary line 203 and a top arc 215*t*, which jointly fully circumscribe second side segment 232*c*. Fourth side segment 232*e* extends between fourth boundary line 209 and a bottom arc 215*b*, which jointly fully circumscribe fourth side segment 232*e*. Second side segment 232*c* and fourth side segment 232*e* are thus symmetrically disposed relative to one another about the yz-plane.

The polarization direction of each polarizer segment may be obtained by the aid of computer simulations, wherein the segmented polarizer (e.g. segmented polarizer 212) and the scattered radiation arriving thereat are modeled. According to some embodiments, in order to obtain the optimal polarization direction of a polarizer segment, the SNR of radiation passed through the polarizer segment—when the illuminated area includes a typical defect—may be maximized over the polarization direction, as explained below in the Methods subsection.

The optimal dimensions (sizes and shapes) of the polarizer segments (e.g. polarizer segments 232) may be obtained in a similar manner by maximizing the SNR of the radiation passed through (all of) the polarizer—when the illuminated area includes a typical defect—over the polarization directions and dimensions pertaining to each of the polarizer segments, respectively.

As clearly seen in FIG. 2B, the shapes of polarizer segments 232 exhibit what, based on simulations (presented in the Results of Simulations subsection), seem to be two of the main characterizing features of the optimal dimensions for p-polarized incident radiation (in the presence of a typical defect), namely: (i) the curving of the boundary lines separating adjacent polarizer segments (except for the boundary line separating the two centermost polarizer segments in the case of an even number of symmetrically-disposed polarizer segments, as depicted, for example, in FIG. 3), and (ii) the narrowing of each polarizer segment from left to right.

Intuitively, this may be attributed, in part, to the fact that—as shown in FIG. 10A—for background noise, for a given value of they coordinate, the change along the x direction in the polarization direction of the scattered radiation (i.e. from parallel to the x-axis to parallel to the y-axis) is more rapid, the greater the value of they coordinate. Thus, an accompanying increase in the "vertical" density of the polarizer segments (as they coordinate is increased) may be required—at least for optimal background noise suppression.

More precisely, for an obliquely directed, and p-polarized, light beam incident from the left, as depicted in FIGS. 1A and 1B, substantially optimally, the side segments may be shaped as curved strips which substantially taper (decrease in width) as they-coordinate increases. Each of the boundary lines in a top half of segmented polarizer 212 (the area of segmented polarizer 212 defined by x>0)—that is, each of boundary lines 201 and 203—curves substantially downwards in the clockwise direction. Thus, first boundary line 201 extends between a point $g_1$, with coordinates $(x_1, y_1, 0)$, and a point $g_4$ with coordinates $(x_4, y_4, 0)$, on the circumference (i.e. the perimeter) of segmented polarizer 212 (on the top half thereof). Second boundary line 203 extends between a point $g_2$, with coordinates $(x_2, y_2, 0)$, and a point $g_3$, with coordinates $(x_3, y_3, 0)$, on the circumference of segmented polarizer 212 (on the top half thereof). $y_1 \leq y_2 < y_3 \leq y_4$, $x_1 > x_4$, and $x_2 > x_3$. The points $g_1$, $g_2$, $g_3$, and $g_4$ are indicated in FIG. 2B.

Similarly, each of the boundary lines in a bottom half of segmented polarizer 212 (the area of segmented polarizer 212 defined by x<0)—that is, each of boundary lines 207 and 209—curves substantially upwards in the clockwise direction.

According to some embodiments, each of boundary line 201, 203, 207, and 209 defines together with (i) they-axis, and a respective pair of arcs on a circumference of the segmented polarizer, which extend from the boundary line to they-axis, a convex area. Thus, for example, the area delimited by first boundary line 201, the y-axis, the arc extending between the point $g_1$ and the y-axis, and the arc extending between the point $g_4$ and the y-axis may be convex. Similarly, the area delimited by second boundary line 203, the y-axis, the arc extending between the point $g_2$ and the y-axis, and the arc extending between the point $g_3$ and the y-axis may be convex.

As expanded on in the Results of Simulations subsection, and explicitly demonstrated therein for a semi-continuous polarizer, it seems that, optimally, the farther the boundary line is from the perpendicular plane (or, what amounts to the same thing, the farther the boundary line from they-axis), the greater the curvature of the boundary line. Thus, according to some embodiments, second boundary line 203 (which is subtended between the points $g_2$ and $g_3$) may be more curved than first boundary line 201 (which is subtended between the points $g_1$ and $g_4$). Similarly, according to some embodiments, fourth boundary line 209 may be more curved than third boundary line 207.

In addition, as expanded on in the Results of Simulations subsection, and explicitly demonstrated therein for a semi-continuous polarizer, it seems that, optimally, the shapes of the boundary lines may substantially correspond to arcs of circles, each having a greater diameter than segmented polarizer 212. In particular, according to some embodiments, the farther the boundary line from the perpendicular plane, the smaller the diameter associated with an arc that substantially matches the boundary line (i.e. the diameter of the circle whose arc substantially matches the boundary line). Thus, the diameter associated with a first arc, which substantially matches second boundary line 203, may be smaller than the diameter associated with a second arc, which substantially matches first boundary line 201. Similarly, the diameter associated with a third arc, which substantially matches fourth boundary line 209, may be smaller than the diameter associated with a fourth arc, which substantially matches third boundary line 207.

Also depicted in FIG. 2A is an optical mask 224, which is a specific embodiment of optical mask 124. As mentioned above, and as shown in the Results of Simulations subsection, according to some embodiments, to increase the SNR of a typical-defect radiation signal passed through a segmented polarizer, such as segmented polarizer 212, an optical mask, such as optical mask 224, may be employed to mask one or more regions on the segmented polarizer (so that the one or more regions are not irradiated by the scattered radiation). According to some embodiments, and as depicted in FIG. 2A, Optical mask 224 may be configured to be positioned adjacently to segmented polarizer 212, as indicated by dashed arrows D.

To facilitate the description by way of an explicit example, optical mask 224 is assumed to be configured to fully prevent central segment 232a from being irradiated, and to partially prevent first side segment 232b and third side segment 232d from being irradiated. More specifically, optical mask 224 is assumed to be configured to prevent from being irradiated (i) a strip 252b (indicated in FIG. 2C) of first side segment 232b, adjacent to central segment 232a, and (ii) a strip 252d (indicated in FIG. 2C) of third side segment 232d, adjacent to central segment 232a.

While a first side 254a and a second side 254b (indicated in FIG. 2A) of mask 224 are depicted as straight, it is to be understood that other shapes may apply. In particular, according to some embodiments, each of first side 254a and second side 254b may be curved.

FIG. 2C presents a schematic perspective bottom view of segmented polarizer 212, according to some embodiments. The region of segmented polarizer 212, masked by optical mask 224, is colored in black.

FIG. 2D presents a schematic bottom view of optical mask 224, according to some embodiments. According to some embodiments, optical mask 224 may be configured to allow changing the dimensions thereof and thereby changing the dimensions and/or location of the region of segmented polarizer 212 that is masked (blocked) by optical mask 224. By way of example, according to some embodiments, and as depicted in FIG. 2D, optical mask 224 may be configured to switch between contracted and expanded configurations, which may resemble contracted and expanded configurations of a hand fan. Dashed arrows $F_1$ and dashed arrows $F_2$ serve to illustrate the expansion from a contracted configuration to an expanded configuration. In the contracted configuration, optical mask 224 is dimensioned as in FIG. 2A. In the expanded configuration, in comparison to the first configuration, optical mask 224 further extends over areas $A_1$ and $A_2$.

According to some embodiments, intermediate configurations between the contracted configuration and the expanded configuration may also be possible. Further, according to some embodiments, optical mask 224 may be contracted beyond the contracted configuration and/or expanded beyond the expanded configuration.

FIG. 2E schematically depicts a segmented polarizer 212', according to some embodiments. Segmented polarizer 212' is a specific embodiment of segmented polarizer 212, wherein each of the polarizer segments is a WGP. Segmented polarizer 212' includes a central segment 232a', a first side segment 232b', a second side segment 232c', a third side segment 232d', and a fourth side segment 232e', which are specific embodiments of central segment 232a, first side segment 232b, second side segment 232c, third side segment 232d, and fourth side segment 232e, respectively.

Each of polarizer segments 232' is formed of (i.e. constituted by) a respective WGP: Central segment 232a' is formed of a central WGP 256a', first side segment 232b' is formed of a first side WGP 256b', second side segment 232c' is formed of a second side WGP 256c', third side segment 232d' is formed of a third side WGP 256d', and fourth side segment 232e' is formed of a fourth side WGP 256e'.

Central WGP 256a' includes a planar grid of parallel metallic wires 258a'. As known in the art of WGPs, the orientation of the metallic wires in a WGP determines the polarization direction of the WGP, which is parallel to the planar grid, defined by the parallel metallic wires, and, at the same time, perpendicular to the metallic wires. The orientation of metallic wires 258a' is thus perpendicular to a polarization direction (indicated by a double-headed arrow $P_A'$) of central segment 232a'. Similarly, the orientations of metallic wires 258b' of first side WGP 256b', metallic wires 258c' of second side WGP 256c', metallic wires 258d' of third side WGP 256d', and metallic wires 258e' of fourth side WGP 256e' are perpendicular to the polarization directions of first side segment 232b', second side segment 232c', third side segment 232d', and fourth side segment 232e', respectively. The polarization directions of first side segment 232b', second side segment 232c', third side segment 232d', and fourth side segment 232e' are indicated by double-headed arrows $P_B'$, $P_C'$, $P_D'$, and $P_E'$, respectively.

While the structure of a segmented polarizer, including polarizer segments formed from respective WGPs, has been described explicitly in the five-segment case, as will be apparent to the skilled person, the generalization to four-segments, and, in particular, a number of segments greater than five, is straightforward.

According to some embodiments, not depicted in FIGS. 2A-2E, the boundary lines may be straight. According to some such embodiments, slopes of the boundary lines may be such as to maximize the SNR of radiation filtered through the segmented polarizer under the constraint that the boundary lines are straight. According to some such embodiments, continuations of the boundary lines outside the segmented polarizer do not all meet at a single point (i.e. the segmented polarizer is not radial).

FIG. 3 schematically depicts a bottom view of a segmented polarizer 312, according to some embodiments. Segmented polarizer 312 is a specific embodiment of segmented polarizer 112. Segmented polarizer 312 is shown as including six polarizer segments, and as such constitutes an example of a segmented polarizer which includes an even number of polarizer segments. Segmented polarizer 312 may be configured to be utilized in conjunction with an obliquely directed, p-polarized incident radiation. More specifically, segmented polarizer 312 includes a first central segment 332a, a first side segment 332b, a second side segment 332c, a second central segment 332d, a third side segment 332e, and a fourth side segment 332f. Segmented polarizer 312 exhibits mirror symmetry about the yz-plane (i.e. the perpendicular plane, which corresponds to the incidence plane M in some embodiments of system 100 including segmented polarizer 312): Second central segment 332d constitutes a mirror-image of first central segment 332a, third side segment 332e constitutes a mirror-image of first side segment 332b, and fourth side segment 332f constitutes a mirror-image of second side segment 332c.

A central boundary line 301 separates second central segment 332d and first central segment 332a. A first side boundary line 311 separates first central segment 332a and first side segment 332b. A second side boundary line 313 separates first side segment 332b and second side segment 332c. A third side boundary line 317 separates third side segment 332e and second central segment 332d. A fourth side boundary line 319 separates fourth side segment 332f and third side segment 332e. According to some embodiments, side boundary lines 311 and 313 are curved similarly to boundary lines 201 and 203 of segmented polarizer 212, and side boundary lines 317 and 319 are curved similarly to boundary lines 207 and 209 of segmented polarizer 212 (while central boundary line 301 is straight). In particular, second side boundary line 313 may be more curved than first side boundary line 311, and fourth side boundary line 319 may be more curved than third side boundary line 317.

Polarization directions of first central segment 332a, first side segment 332b, second side segment 332c, second central segment 332d, third side segment 332e, and fourth side segment 332f are indicated by double-headed arrows $P_1$, $P_2$, $P_3$, $P_4$, $P_5$, and $P_6$, respectively. Also indicated is a circumference 350 of segmented polarizer 312.

According to some embodiments (which may be applicable also to segmented polarizers with an odd number of polarizer segments, such as the segmented polarizers of FIG. 2A and FIG. 4A), respective polarization directions of the polarizer segments are substantially parallel to respective tangents to an ellipse (not shown), which is bisected by the perpendicular plane (and by the incidence plane in embodiments wherein the system is configured such that the incidence plane coincides with the perpendicular plane), and whose center is positioned farther than a center of the segmented polarizer, as measured along an axis, defined by a tangential component of a wavevector of the incident light beam. According to some such embodiments, the tangential component of the wavevector points in the direction defined by the (positive) y-axis, so that the center of the ellipse has a positive y coordinate (segmented polarizer 312 is shown centered at x=0 and y=0).

According to some embodiments (which may be applicable also to segmented polarizers with an odd number of polarizer segments, such as the segmented polarizers of FIG. 2A and FIG. 4A), polarization directions of polarizer segments in a first half-circle (i.e. the half-circle defined by x>0 in FIG. 3) of the segmented polarizer—positioned to the left of a first axis, when facing in a direction defined by a tangential component of a wavevector of the incident light beam (i.e. facing in the direction of the positive y-axis)—may be rotated clockwise from a second axis (i.e. the x-axis) perpendicular to the first axis, such that the farther the polarizer segment from the perpendicular plane (bisecting the segmented polarizer into two symmetrical parts), the greater the rotation of the respective polarization direction. Polarization directions of polarizer segments in a second half-circle (i.e. the half-circle defined by x<0 in FIG. 3) of the segmented polarizer, which is complementary to the first half-circle, are rotated anti-clockwise from the second axis, such that the farther the polarizer segment from the perpendicular plane, the greater the rotation of the respective polarization direction.

FIG. 4A presents a schematic bottom view of a segmented polarizer 412, according to some embodiments. Segmented polarizer 412 is a specific embodiment of segmented polarizer 112 and is configured to be used in conjunction with an obliquely directed, p-polarized incident radiation. Segmented polarizer 412 includes a plurality of polarizer segments 432 (as a non-limiting example, thirteen in FIG. 4A), not all of which are numbered. Segmented polarizer 412 exhibits mirror symmetry about the yz-plane (i.e. the perpendicular plane, which corresponds to the incidence plane M in some embodiments of system 100 including segmented polarizer 412). More specifically, polarizer segments 432 include a central segment 432a bordered from above and below by two curved boundary lines (not numbered), respectively. The two curved boundary lines are symmetrically disposed relative to one another about the y-axis. Also indicated, by a (double-headed) arrow $P_M$, is a polarization direction of central segment 432a, which is configured to filter therethrough light polarized in parallel to the x-axis.

Polarizer segments 432 include six polarizer segments 432u positioned above central segment 432a and six polarizer segments 432d positioned below central segment 432a. To each of polarizer segments 432u corresponds a polarizer segment from polarizer segments 432d, which is a mirror image thereof, in the sense that each such pair of polarizer segments exhibits mirror symmetry about the yz-plane, both in terms of dimensions and locations thereof, as well as in terms of the polarization directions thereof. For example, a polarizer segment 432u2, from polarizer segments 432u, and a polarizer segment 432d2, from polarizer segments 432d, are symmetrically disposed relative to one another about the yz-plane. Further, a polarization direction (indicated by a double-headed arrow $P_U^{(2)}$) of polarizer segment 432u2 is rotated clockwise from the positive x-axis by the same angle as a polarization direction (indicated by a double-headed arrow $P_D^{(2)}$) of polarizer segment 432d2 is rotated anti-clockwise from the negative x-axis. Similarly, a polarizer segment 432u3, from polarizer segments 432u, and a polarizer segment 432d3, from polarizer segments 432d, are symmetrically disposed relative to one another about the yz-plane, with a polarization direction (indicated by a double-headed arrow $P_U^{(3)}$) of polarizer segment 432u3 being rotated clockwise from the positive x-axis by the same angle as a polarization direction (indicated by a double-headed arrow $P_D^{(3)}$) of polarizer segment 432d3 is rotated anti-clockwise from the negative x-axis.

Polarizer segment 432u3 is adjacent from above to polarizer segment 432u2 and polarizer segment 432d3 is adjacent from below to polarizer segment 432d2. Also indicated is a polarizer segment 432u4, which is adjacent from above to polarizer segment 432u3, and a polarization direction (indicated by a double-headed arrow of $P_U^{(4)}$) of polarizer segment 432u4. According to some embodiments, an absolute difference between the polarization angles of each two adjacent segments from polarizer segments 432—for example, polarizer segments 432u2 and 432u3—is smaller than (i) an absolute deviation of a polarization angle of the scattered radiation arriving at polarizer segment 432u2 in the absence of a defect in the illumination area, and (ii) an absolute deviation of a polarization angle of the scattered radiation arriving at polarizer segment 432u3 in the absence of a defect in the illumination area.

The polarization direction $P_U^{(4)}$ is rotated more (clockwise relative to the positive x-axis) than the polarization direction $P_U^{(3)}$, which in turn is rotated more (clockwise relative to the positive x-axis) than the polarization direction $P_U^{(2)}$, and so on. Similarly, the polarization direction $P_D^{(3)}$ is rotated more (anti-clockwise relative to the negative x-axis) than the polarization direction $P_D^{(2)}$, and so on.

According to some embodiments, and as depicted in FIG. 4A, boundary lines separating adjacent polarizer segments in an upper semicircle of segmented polarizer 412 may be curved in a similar manner to the curving of boundary lines 201 and 203 of segmented polarizer 212. Thus, for example, a boundary line 405, separating polarizer segment 432u2 from polarizer segment 432u3, may curve substantially downwards in the clockwise direction, and, moreover may be shaped as an arc of circle having a greater diameter than segmented polarizer 412, as elaborated on below in the Results of Simulations subsection. A boundary line 415, separating polarizer segment 432u3 from polarizer segment 432u4, may curve substantially downwards in the clockwise direction, and, moreover may be shaped as an arc of circle having a greater diameter than segmented polarizer 412, as elaborated on below in the Results of Simulations subsection. Boundary line 415 may be more curved than boundary line 405. (Similarly, boundary lines separating adjacent polarizer segments in a bottom semicircle of segmented polarizer 412 may be curved in a similar manner to the curving of boundary lines 207 and 209 of segmented polarizer 212.)

More specifically, according to some embodiments (which may be applicable also to side segments of segmented polarizers with an even number of polarizer segments, such as the segmented polarizer of FIG. 3), each of the boundary lines may curve away both from a respective chord, on which the boundary line is suspended, and from the perpendicular plane (i.e. the yz-plane in FIG. 4A). Thus, boundary line 405, which delimits (bounds) polarizer segment 432*u*2 from above, and which is suspended on a chord 419, is positioned above both chord 419 (except on the endpoints (not numbered) of boundary line 415) and the y-axis. (And in this sense, curves away from both.) Similarly, a boundary line 425, which delimits (bounds) a polarizer segment 432*d*1 from below, and which is suspended on a chord 429, is positioned below both chord 429 (except on the endpoints (not numbered) of boundary line 425) and the y-axis.

As used herein, a boundary line is said to be "suspended" on a chord (of a circle), when the boundary line and the chord have the same endpoints (which are positioned on the circumference of the segmented polarizer). In other words, the chord extends between the endpoints of the boundary line.

FIG. 4B presents a schematic bottom view of segmented polarizer 412 and an optical mask 424 disposed adjacently thereto, according to some embodiments. Unlike the embodiments of optical mask 224 depicted in FIGS. 2A and 2C, optical mask 424 is configured to effect a more complex masking pattern, which is not confined, or substantially confined, between two chords in the pupil. Since the vertical density of polarizer segments 432 increases with they coordinate, along a left fringe 444 of segmented polarizer 412, the vertical density of polarizer segments 432 is minimum. Consequently, the filtering out of background noise radiation by left fringe 444 may be less effective as compared to the rest of segmented polarizer 412, particularly, when taking into account that the intensity of background noise radiation may be maximum along the left fringe of the pupil for a p-polarized light beam incident from the left. This last point is illustrated in FIG. 10B in the Results of Simulations subsection.

The masking pattern effected by optical mask 424 is configured to take into account—by fully masking left fringe 444 and not only a mid-portion thereof, as described below—the fact that the maximum intensity of the background noise is concentrated in the left fringe of the pupil.

More specifically, as depicted in FIG. 4B according to some embodiments, optical mask 424 includes a main section 462, which is shaped similarly to optical mask 224, and two wedge-like portions extending from a left-end portion of main section 462: an upper wedge-like portion 464*u* and a lower wedge-like portion 464*d*. Optical mask 424 is shaped and dimensioned such that, when optical mask 424 is properly positioned adjacently to segmented polarizer 412, upper wedge-like portion 464*u* extends along an upper part of left fringe 444, and lower wedge-like portion 464*d* extends along a lower part of left fringe 444. Optical mask 424 is thus configured to block radiation arriving at substantially all of left fringe 444, thereby increasing the SNR.

As a non-limiting example, to render the description more concrete, in FIG. 4B, main section 462 is shown as fully masking all three polarizer segments between polarizer segments 432*u*2 and 432*d*2 and partially masking each of polarizer segments 432*u*2 and 432*d*2. Upper wedge-like portion 464*u* partially blocks polarizer segment 432*u*2, and the three polarizer segments immediately there above, but does not block a top polarizer segment 432*t'*. Lower wedge-like portion 464*d* partially blocks polarizer segment 432*d*2, and the three polarizer segments immediately there below, but does not block a bottom polarizer segment 432*b'*.

FIG. 5 schematically depicts a system 500 for optical imaging of defects on unpatterned wafers, according to some embodiments. System 500 is a specific embodiment of system 100. System 500 includes an illumination module 502, relay optics 506, a segmented polarizer 512, and a detector 516, which are specific embodiments of illumination module 102, relay optics 106, segmented polarizer 112, and detector 116, respectively. System 500 may further include additional optics 528 configured to relay radiation filtered through segmented polarizer 512 to detector 516. According to some embodiments, system 500 may further include an optical mask 524 and/or a waveplate 526, which are a specific embodiment of optical mask 124 and waveplate 126, respectively. Also depicted are an unpatterned wafer 520, and a stage 518, which is a specific embodiment of stage 118.

According to some embodiments, imaging module 502 includes a light source 536 (a laser source), and optionally a polarizing element 538, such as a half-wave plate or a quarter-wave plate, configured to allow controllably selecting the polarization of an incident light beam $L_I'$ (e.g. laser beam) emitted by illumination module 502. According to some embodiments, polarizing element 538 may be, or include, a polarization filter. According to some such embodiments, the polarization filter may be controllably rotatable, allowing (i) to controllably rotate the transmission axis thereof, and, thereby, (ii) select the polarization direction (e.g. p or s polarization) of the incident light beam $L_I'$.

Relay optics 506 includes an objective lens 508, which is a specific embodiment of objective lens 108, and additional optical components 542, positioned between objective lens 508 and segmented polarizer 512, or between objective lens 508 and optical mask 524 (in embodiments including optical mask 524). Additional optical components 542 may include one or more additional lenses 548, which are configured to further focus the collimated light beam exiting objective lens 508 and prevent dispersion thereof (by re-collimating the light beam).

Additional optics 528 constitutes, or includes, a tube lens 554 configured to focus onto detector 516 light passed by segmented polarizer 512.

Also indicated in FIG. 5 are an optical axis A' and a pupil plane O' (along which segmented polarizer 512 may be set) of relay optics 506, as well as an illumination area 523 produced by the incident light beam $L_I'$ on unpatterned wafer.

According to an aspect of some embodiments, there is provided an optical-based unpatterned wafer inspection system. FIG. 6 is a block diagram of such an unpatterned wafer inspection system, a system 600, according to some embodiments. System 600 includes scanning equipment 602 and a scan data analysis module 604. Scanning equipment 602 includes an optical scanning module 612, a stage 616, and a controller 618. Scanning equipment 602 is delineated by a dashed-double-dotted box to indicate that components therein (e.g. optical scanning module 612 and stage 616) may be separate from one another, e.g. in the sense of not being included in a common housing.

Optical scanning module 612 is similar to system 100. According to some embodiments, optical scanning module 612 is a specific embodiment of system 100. That is, in such embodiments, system 100 constitutes a subsystem of system 600.

Stage 616 is configured for placement thereon of a sample, such as an (unpatterned) wafer, which is to be inspected for the presence of defects. According to some embodiments, stage 616 may be moveable, as elaborated on below.

Controller 618 may be functionally associated with optical scanning module 612 and stage 616, as well as with scan data analysis module 604. More specifically, controller 618 is configured to control and synchronize operations and functions of the above-listed modules and components during a scan of an (unpatterned) wafer. For example, stage 616 may be configured to support an inspected sample, such as an unpatterned wafer 620, and to mechanically translate the inspected sample along a trajectory set by controller 618, which also controls optical scanning module 612.

Scan data of an unpatterned wafer, obtained by scanning equipment 602, may be relayed to scan data analysis module 604. Scan data analysis module 604 is configured to detect defects (if present) on the unpatterned wafer, based on the obtained scan data (relayed thereto). Scan data analysis module 604 includes computer hardware (one or more processors, such as image and/or graphics processor units, and volatile as well as non-volatile memory components; not shown). The computer hardware is configured to analyze the scan data (obtained by optical scanning module 612), of a region on unpatterned wafer 620, for presence of defects in the region, as known in the art of optical inspection of unpatterned wafers.

According to some embodiments, optical scanning module 612 includes an optical mask, which can be switched between different configurations having different dimensions (e.g. shape and/or size), essentially as described above with respect to optical mask 224. According to some such embodiments, scan data analysis module 604 may be configured to determine an optimal configuration for the optical mask and instruct controller 618 to switch the optical mask to the optimal configuration.

The optimal configuration of the optical mask may be determined based on previously obtained scan data, for example, from previously scanned unpatterned wafers from a same batch.

According to an aspect of some embodiments, there is provided a system for unpatterned wafer defect review (that is, review of defects on unpatterned wafers). FIG. 7 is a block diagram of such an unpatterned wafer inspection system, a system 700, according to some embodiments. System 700 includes reviewing equipment 702 and a defect review module 704. Reviewing equipment 702 includes an optical imaging module 712, an e-beam imaging module 714, a stage 716, and a controller 718. Reviewing equipment 702 is delineated by a dashed-double-dotted box to indicate that components therein (e.g. optical imaging module 712 and stage 716) may be separate from one another, e.g. in the sense of not being included in a common housing.

Optical imaging module 712 is similar to system 100. According to some embodiments, optical imaging module 712 is a specific embodiment of system 100. That is, in such embodiments, system 100 constitutes a subsystem of system 700.

Stage 716 is configured for placement thereon of a previously inspected (unpatterned) wafer 720, which is to be reviewed. According to some embodiments, stage 716 may be moveable, as elaborated on below.

Controller 718 may be functionally associated with optical imaging module 712, e-beam imaging module 714, and stage 716, as well as with defect review module 704. More specifically, controller 718 is configured to control and synchronize operations and functions of the above-listed modules and components during a review of an (unpatterned) wafer. For example, stage 716 may be configured to support a reviewed sample, such as unpatterned wafer 720, and to mechanically translate the reviewed sample, according to instructions received from controller 718, such as to allow optical imaging module 712 and/or e-beam imaging module 714 to image one or more defects in a received or obtained defect map (i.e. a map specifying coordinates of defects on an (unpatterned) wafer).

According to some embodiments, defect review module 704 is configured to receive images, obtained by optical imaging module 712, of defects on an unpatterned wafer. The defects may be specified in a defect map, which specifies coordinates of each of the defects. The defect map may be received from an unpatterned wafer inspection system. Defect review module 704 includes computer hardware (one or more processors, such as image and/or graphics processor units, and volatile as well as non-volatile memory components; not shown). Based on the received images, the computer hardware is configured to redetect the defects, and thereby correct the defect map. The corrected defect map may be sent to controller 718. Controller 718 is configured to translate stage 716, according to the corrected defect map, such as to allow e-beam imaging module 714 to obtain higher resolution images of each of the defects in the (corrected) defect map.

Defect review module 704 is further configured to receive the higher resolution images obtained by e-beam imaging module 714 of the (e-beam imaged) defects. The computer hardware (in defect review module 704) may further be configured to classify the defects, based on the received higher resolution images thereof, as known in the art of SEM-based review of defects on unpatterned wafers.

Methods

According to an aspect of some embodiments, there is provided a method for increasing SNR in optical imaging of defects on unpatterned wafers. FIG. 8 presents a flowchart of such a method 800, according to some embodiments. Method 800 may be implemented utilizing a system for optical imaging of defects on unpatterned wafers, such as system 100, according to some embodiments thereof, and systems similar thereto. Method 800 includes:

An operation 810 of irradiating an area of an unpatterned wafer with a substantially polarized, incident light beam (e.g. incident light beam $L_I$).

An operation 820 of employing relay optics (e.g. relay optics 106) to collect and guide, radiation scattered off the irradiated area (e.g. off illumination area 123), onto a segmented polarizer (e.g. segmented polarizer 112, 212, 212', 312, or 412) including at least four polarizer segments (e.g. polarizer segments 132, 232, 232', 332, or 432), characterized by respective dimensions and polarization angles, such that an SNR of radiation filtered by the polarizer, when a typical defect is present in the irradiated area, is increased as compared to a linear polarizer.

The boundary lines separating the polarizer segments may be curved. More specifically, the boundary lines may curve away from a perpendicular plane, bisecting the segmented polarizer into two symmetric parts (unless the boundary line is on the perpendicular plane), as described above in the description of FIGS. 2A-4B in the Systems subsection. Each of the polarizer segments may be configured to filter light at a respective polarization angle, as described in the description of FIGS. 2A-4B in the Systems subsection.

According to some embodiments, the respective polarization angle of a polarizer segment may be such that, when the irradiated area includes a typical defect, the SNR of the scattered radiation transmitted through the polarizer segment is substantially maximized. According to some embodiments, the respective dimensions (i.e. size and shape) and polarization angles of each of the polarizer segments may be such that, when the irradiated area includes a typical defect, the SNR of the scattered radiation transmitted (i.e. filtered) through (all of) the segmented polarizer is substantially maximized.

According to some embodiments, an absolute difference between polarization angles of each pair of adjacent polarizer segments (from the at least four polarizer segments) may be smaller than (i) an absolute deviation of a polarization angle of background noise radiation arriving at a first of polarizer segment in the pair, and (ii) an absolute deviation of a polarization angle of background noise radiation arriving at the second polarizer segment in the pair.

According to some embodiments, the polarizer segments are substantially complementary in the sense of substantially fully encompassing the segmented polarizer. That is, in such embodiments, the at least four polarizer segments substantially account for the totality of the segmented polarizer.

Alternatively, according to some embodiments, the polarizer segments are non-complementary. According to some such embodiments, the segmented polarizer includes one or more opaque sections.

According to some embodiments, each of the polarizer segments is a wire-grid polarizer.

According to some embodiments, in operation 810, the incident light beam may be irradiated at a non-zero angle with respect to an optical axis (e.g. the optical axis A), defined by the relay optics. In particular, the (non-zero) angle may be such that a (specularly) reflected light beam (e.g. reflected light beam $L_R$) is not collected by the relay optics. According to some embodiments, the (non-zero) angle may be greater than about 10°, about 15°, about 20°, about 30°, about 40°, about 55°, or about 75°. Each possibility corresponds to separate embodiments. According to some embodiments, the incident light beam is obliquely directed (i.e. $\theta_I > 0$, as shown, for example, in FIGS. 1A, 1B, and 5). It is noted that in embodiments wherein the optical axis is normal (perpendicular) to the (irradiated) unpatterned wafer (as depicted in FIG. 1A, for example), the non-zero angle is given by the incidence angle of the incident light beam $L_I$. However, it will be understood that other options are possible. In particular, according to some embodiments, the optical axis is not normal to the unpatterned wafer. According to some such embodiments, the angle of incidence is substantially equal to 0°.

According to some embodiments, the incident light beam may be substantially linearly polarized. The choice of polarization is dependent on the context. Incident p-polarization may be more suitable for detecting small defects, as typically the defect will scatter more (and accordingly reflect less) of incident p-polarization as compared to incident s-polarization. In contrast, s-polarization may be more suitable for rougher surfaces (and, therefore, larger defects).

According to some embodiments, the segmented polarizer is substantially set on a pupil of the relay optics. According to some such embodiments, the optical axis, defined by the relay optics, lies substantially on an incidence plane (e.g. the incidence plane M) of the incident light beam. According to some such embodiments, the incidence plane coincides with the perpendicular plane.

According to some embodiments, the incident light beam is substantially p-polarized or s-polarized. Accordingly, the segmented polarizer is configured such as to substantially displays mirror symmetry about the incidence plane of the incident light beam (as exhibited, for example, by segmented polarizers 212, 212', 312, and 412, which, according to some embodiments are configured to substantially maximize the SNR when utilized in conjunction with p-polarized incident radiation).

According to some embodiments, method 800 further includes an operation 805 wherein an optical mask (e.g. optical mask 124, 224, or 424) is utilized to mask one or more regions on the segmented polarizer from the scattered radiation. The masking may allow increasing the SNR (as compared to when the mask is not utilized). Alternatively, as explained above in the Systems subsection, the increase in SNR may be obtained by a segmented polarizer including one or more opaque section(s). According to some embodiments, the optical mask may be adjustable (e.g. as depicted in FIG. 2D), such as to allow selecting, and/or adjusting the dimensions of the one or more regions which are to be masked.

According to some embodiments, wherein method 800 includes operation 805, the dimensions and polarization angles of each of the at least four polarizer segments, and the dimensions of the optical mask and the positioning thereof relative to the segmented polarizer, are such that the SNR of scattered radiation, passed through the at least four polarizer segments, is substantially maximized when a typical defect is present in the irradiated area.

According to some embodiments, operation 820 further includes utilizing a waveplate (e.g. waveplate 126), positioned between the segmented polarizer and the relay optics, to substantially linearize the scattered radiation arriving at the segmented polarizer. According to some embodiments, different portions of the scattered radiation, differing from one another by respective retardation between vertical polarization components and horizontal polarization components thereof, may be addressed on a portion-by-portion by utilizing a segmented waveplate. That is, in such embodiments, the waveplate includes a plurality of waveplate segments, each waveplate segment being configured to alter by a different amount, respectively, the phase between the vertical polarization component and the horizontal polarization component of radiation arriving at the waveplate segment.

According to some embodiments, method 800 may be applied with respect to different types of typical defects, differing in shape and/or material composition. For example, method 800 may be applied first using a first segmented polarizer, configured to detect spherical defects, and later applied using a second segmented polarizer configured to detect defects forming a rounded bulge (e.g. half-sphere) in the unpatterned wafer.

According to an aspect of some embodiments, there is provided a computerized method for optical inspection of unpatterned wafers. The method may be implemented utilizing system 600 or a system similar thereto, which includes system 100. According to some embodiments, the method includes:

Implementing method 800 with respect to an unpatterned wafer.

Employing at least one detector (e.g. detector 116) to sense scattered radiation passed through the segmented polarizer (e.g. segmented polarizer 112), thereby obtaining image data of the unpatterned wafer.

Analyzing the obtained image data (e.g. using scan data analysis module 604) to detect defects on the unpatterned wafer.

According to an aspect of some embodiments, there is provided a computerized method for unpatterned wafer defect review. The method may be implemented utilizing system 700 or a system similar thereto which includes system 100. The method includes an optical-based stage and an e-beam based stage. According to some embodiments, the optical-based stage includes:

Receiving an unpatterned wafer including one or more detected defects and a defect map specifying coordinates of the one or more detected defects.

Generating a corrected defect map by, for each of the one or more detected defects:

Implementing method 800 with respect to an area (on the unpatterned wafer) including the detected defect.

Forming an image of the detected defect from scattered radiation passed through the segmented polarizer (e.g. segmented polarizer 112, 212, 212', 312, or 412).

Analyzing the formed image (e.g. using defect review module 704) to correct, if necessary, the coordinates of the detected defect.

According to some embodiments, the e-beam based stage includes:

Employing a SEM (e.g. included in e-beam imaging module 714) to review the one or more defects, based on the corrected defect map.

Reviewing (e.g. using defect review module 704) SEM-obtained images of the one or more defects.

According to an aspect of some embodiments, there is provided a method for manufacturing a n≥4 segmented polarizer, such as segmented polarizer 112 according to some embodiments thereof. The manufactured segmented polarizer is configured for increasing SNR in optical imaging of defects on unpatterned wafers. FIG. 9 presents a flowchart of such a method 900, according to some embodiments. Method 900 includes:

An operation 910 wherein scattering data of a polarized light beam—incident on an area, of an unpatterned wafer, including a typical defect—is obtained. The scattering data is indicative of a spatial dependence of the scattering cross-section (of the scattered radiation) across a pupil plane, whereon the segmented polarizer is to be set.

An operation 920, wherein, based on the scattering data, substantially optimal dimensions and polarization angles of the n polarizer segments are computed. The substantially optimal dimensions and polarization angles of the n polarizer segments may be obtained using software to simulate the segmented polarizer and the scattered light (scattered from the region including the typical defect) arriving thereat. The simulation may then be utilized to maximize, over the n dimensions and polarization angles, a SNR of the scattered radiation, which may be passed through the n polarizer segments.

An operation 930, wherein the segmented polarizer is manufactured in accordance with the obtained substantially optimal dimensions and polarization angles.

As described above in the Systems subsection, and explicitly demonstrated in the next subsection, optimally, boundary lines separating adjacent polarizer segments may be curved.

Results of Simulations

This subsection presents results of computer simulations, which demonstrate the utility of the systems and methods disclosed herein. System 100 was simulated (i.e. modeled by software), according to some embodiments thereof. The simulations depict distributions of intensity and polarization direction—across the pupil plane—of light "scattered" by (simulated) system 100 in the absence and in the presence of a typical defect in an illuminated area on an unpatterned wafer. In particular, the simulation results provide an indication of how the SNR of filtered radiation is expected to increase with the number of polarizer segments.

Each of FIGS. 10A and 10B depicts the distribution of polarization direction and of intensity, respectively, across the pupil plane for pure background noise in the absence of filtering (i.e. when no polarizer was employed to filter the light arriving at the pupil). Each of FIGS. 10C and 10D depicts the distribution of polarization direction and of intensity, respectively, across the pupil plane for a radiation signal associated with a typical (three-dimensional) defect in the absence of filtering. The radiation signal was obtained by "impinging" an obliquely directed, and p-polarized, light beam from the left on an area of an unpatterned wafer including a typical defect, as depicted in FIGS. 1A and 1B. The same settings for the simulated light beams were used in each of the simulations whose results are presented in this subsection.

The typical defect was modeled as being spherical and characterized by scattering properties of a glass material.

Referring to FIGS. 10A and 10C, green represents polarization parallel to the x-axis, while red represents polarization parallel to the y-axis. Referring to FIGS. 10B and 10D, a two-color scale is used to represent the intensity: Dark-blue corresponds to (minimum) zero intensity while bright yellow corresponds to maximum intensity (so that the mid-section of the scale is colored green, ranging from bluish-green to yellowish-green). It is noted that the maximum intensity of pure background noise is concentrated about a left fringe F L of the pupil. In contrast, the maximum intensity of a typical-defect radiation signal is concentrated about a right half HR of the circumference of the pupil.

The same (cartesian) coordinate system is used in FIGS. 10A-10D to (spatially) parametrize the pupil. It is noted that the coordinate system is the same as that used in FIG. 2A to parameterize segmented polarizer 212. The same coordinate system is also used to parametrize the other figures in this subsection.

Each of the intensity distributions depicted in FIGS. 11A-11D, 12A-12D, 13A-13D, and 14A-14D was obtained under different simulation settings, respectively. The different simulation settings differ from one another in one or more of: the simulated segmented polarizer utilized (if at all), whether an optical mask was employed (and, if so, the dimensions thereof), the numerical aperture (NA) of the simulated relay optics, and whether a defect was present or absent in the illumination area. Different segmented polarizers (corresponding to different embodiments of segmented polarizer 112) were simulated, differing from one another in the number of polarizer segments, the dimensions thereof, and/or the polarization directions thereof. Otherwise, the simulation settings were similar. In particular, the same wavelength, the same incidence angle, and the same incidence polarization—i.e. p-polarization incident from the left as depicted in FIGS. 1A and 1B—were "employed" throughout.

It is noted that the simulation results of FIGS. 11C, 12C, 13C, and 14C are not the product of an optimization algorithm and are therefore not expected to be optimal. In particular, in FIGS. 11C, 12C, 13C, and 14C, the boundary lines between adjacent polarizer segments were fixed to be straight. As such, the obtained simulation results of FIGS. 11C, 12D, 13C, and 14C provide an indication of SNRs achievable in the five-segment case. The optimal SNRs are expected to be higher.

The results of FIG. 11D are the product of an optimization algorithm under the constraint that the angular resolution is fixed (so that by lifting this constraint an even higher SNR is expected). In contrast, the results of FIGS. 12D, 13D, and 14D are not optimal since the dimensions of the mask were not optimized over. Accordingly, the actual optimal SNRs are expected to be higher.

Referring to FIGS. 11A-11D, the simulations were performed at NA=0.5 and without masking (and with the polarizer segments of each segmented polarizer fully encompassing the segmented polarizer). FIG. 11A shows the distribution of intensity across the pupil for pure background noise (top) and in the presence of a typical defect in the illumination area (bottom), in the unfiltered case (i.e. when the scattered light arriving at the pupil is not filtered). A multi-color scale, depicted in FIG. 11E, was employed to represent the intensity. It is to be understood that in each of the intensity distributions depicted, the maximum intensity (although always colored in dark red) corresponds to a different value. In other words, the scaling of the intensity scale varies from one intensity distribution to another. In particular, the top end of the scale of an intensity distribution, obtained in the absence of a polarizer (i.e. without filtering, as in the bottom row of FIG. 11A, for example), may be significantly larger than that of an intensity distribution obtained utilizing a polarizer (i.e. with filtering, as in the middle row of FIG. 11C, for example).

FIGS. 11B, 11C, and 11D show the distribution of intensity across the pupil for pure background noise (top) and a typical-defect radiation signal (middle), in the case of a uniform polarizer, a five-segment polarizer, and a semi-continuous polarizer. The uniform polarizer is depicted at the bottom of FIG. 11B, the five-segment polarizer is depicted at the bottom of FIG. 11C, and the semi-continuous polarizer is depicted at the bottom of FIG. 11D.

The respective dimensions of the polarizer segments of the simulated segmented polarizers (FIGS. 11C and 11D, bottom) are indicated by varying shades of blue and red. In the case of an odd number of polarizer segments (as in FIG. 11C), the central segment is colored blue. Side segments above the central segment are colored in increasingly lighter shades of blue. Side segments below the central segment are colored in increasingly lighter shades of red. In the case of an even number of polarizer segments (as in FIG. 11D). Polarizer segments in the top half of the segmented polarizer are colored in increasingly lighter shades of blue. Polarizer segments on the bottom half of the segmented polarizer are colored in increasingly lighter shades of red.

The respective dimensions and polarization directions (not specified) of the polarizer segments of each of the segmented polarizers were selected to jointly exhibit mirror-symmetry about they-axis, reflecting the mirror-symmetry about they-axis of the polarization directions and intensity distributions of pure background noise and a typical-defect radiation signal (i.e. for a p-polarized light beam incident on the unpatterned wafer from the left, as depicted in FIGS. 1A and 1B). In particular, the polarization direction of the uniform polarizer was set parallel to the x-axis, as was the polarization direction of the central segment of the five-segment polarizers. (The semi-continuous polarizer included an even number of polarizer segments.) The polarization directions of the side segments above the central segment are rotated clockwise from the x-axis, while the polarization directions of the side segments below the central segment are rotated counter-clockwise from the x-axis, essentially as depicted in FIGS. 2A, 2B, 3, and 4A.

In contrast to the multi-segment polarizers (i.e. segmented polarizers), the power of the radiation filtered through the uniform polarizer did not reach threshold detection. The SNR of the radiation filtered through the semi-continuous polarizer is greater by a factor of approximately 14.4 than the SNR of the radiation of filtered through the five-segment polarizer.

In contrast to the simulation settings of FIGS. 11A-11D, in the simulation settings of FIGS. 12A-12D, 13A-13D, and 14A-14D an optical mask was "employed" to further increase the SNR. In FIGS. 12A-12D the NA was set to 0.5, in FIGS. 13A-13D the NA was set to 0.7, and in FIGS. 14A-14D the NA was set to 0.95. The simulation results are presented in a similar layout to that of FIGS. 11A-11D, as summarized in Table 1 below. Further, the multi-color scale of FIG. 11E is also used to quantify the intensity in each of the simulations of FIGS. 12A-12D, 13A-13D, and 14A-14D. To facilitate the perusal of the figures, the multi-color scale of FIG. 11E is reproduced in each of FIGS. 12E, 13E, and 14E.

The respective dimensions of the polarizer segments of the simulated segmented polarizers of FIGS. 12C and 12D, 13C and 13D, and 14C and 14D are indicated by varying shades of blue and red. A central region of the segmented polarizer, which is masked, is colored in dark blue, and is, moreover, delineated (delimited) by a dashed-dotted line. Side segments above the central segment are colored in increasingly lighter shades of blue. Side segments below the central segment are colored in increasingly lighter shades of red.

In each of FIGS. 12C and 12D, 13C and 13D, and 14C and 14D, the polarization directions of the side segments, in the top half (i.e. x>0) of the respective segmented polarizer, are rotated clockwise from the x-axis, while the polarization directions of the side segments, in the bottom half (i.e. x<0) of the respective segmented polarizer, are rotated counter-clockwise from the x-axis, essentially as depicted in FIGS. 2A, 2B, 3, and 4A.

TABLE 1

| presentation format of FIGS. 12A-12D, 13A-13D, and 14A-14D | | | | |
|---|---|---|---|---|
| | No filtering | Uniform polarizer | "Four-segment" polarizer | Semi-continuous polarizer |
| Pure background noise | FIGS. 12A, 13A, and 14A - top | FIGS. 12B, 13B, and 14B - top | FIGS. 12C, 13C, and 14C - top | FIGS. 12D, 13D, and 14D - top |

TABLE 1-continued presentation format of FIGS. 12A-12D, 13A-13D, and 14A-14D

|  | No filtering | Uniform polarizer | "Four-segment" polarizer | Semi-continuous polarizer |
|---|---|---|---|---|
| Typical-defect radiation signal | FIGS. 12A, 13A, and 14A - bottom | FIGS. 12B, 13B, and 14B - middle | FIGS. 12C, 13C, and 14C - middle | FIGS. 12D, 13D, and 14D - middle |
| Dimensions of polarizer segments |  | FIGS. 12B, 13B, and 14B - bottom | FIGS. 12C, 13C, and 14C - bottom | FIGS. 12D, 13D, and 14D - bottom |

Before proceeding with the presentation of the simulation results, it is noted that "masking" may also be achieved by employing a segmented polarizer, which includes an opaque section extending over what would otherwise (i.e. in embodiments wherein the segmented polarizer does not include an opaque section) constitute the masked region. As mentioned above, in each of FIGS. 12C and 12D (bottom), 13C and 13D (bottom), and 14C and 14D (bottom), the masked region is delineated by a (white) dashed-dotted line.

To obtain an estimate of the increase in the SNR, which may be provided by masking, or by employing a segmented polarizer including an opaque section, the simulation results of FIGS. 12A-12D may be compared to those FIGS. 11A-11D. Regions on the polarizer, whereto a typical-defect radiation signal is substantially not scattered, may be masked.

Referring to FIG. 12C, it is noted that a four-segment polarizer (as depicted in FIG. 12C, bottom) may in principle be obtained from a five-segment polarizer (as depicted in FIG. 11C, bottom) by masking a central region of the five-segment polarizer, such that the central region includes in full the central segment. Accordingly, the SNR, which is obtained when employing the four-segment polarizer (FIG. 12C, bottom) is compared to the SNR, which is obtained when employing the five-segment polarizer (FIG. 11C, bottom). The blocking of the central region advantageously improves the SNR by a factor of approximately 2.9.

Finally, the SNR, which is obtained when employing the semi-continuous polarizer of FIG. 12D, is compared to the SNR, which is obtained when employing the semi-continuous polarizer of FIG. 11D. The blocking of the central region advantageously improves the SNR by a factor of approximately 1.5.

Higher SNRs may be obtained as the NA is increased. To obtain an estimate of the increase, the simulation results of FIGS. 13A-13E, and FIGS. 14A-14E, may be compared to those FIGS. 12A-12E. Referring first to FIGS. 13A-13E, as compared to the simulations settings of FIGS. 12A-12E, the NA was increased by 40% (i.e. from NA=0.5 to NA=0.7). In the four-segment case (FIG. 12C and FIG. 13C), this led to an increase by a factor of approximately 1.4 in the SNR. In the semi-continuous case (FIG. 12D and FIG. 13D), this led to an increase by a factor of approximately 1.1 in the SNR.

Referring to FIGS. 14A-14E, as compared the simulations settings of FIGS. 12A-12E, the NA was increased by 90% (i.e. from NA=0.5 to NA=0.95). In the four-segment case (FIG. 12C and FIG. 14C), this led to an increase by a factor of approximately 1.9 in the SNR. In the semi-continuous case (FIG. 12D and FIG. 14D), this led to an increase by a factor of approximately 1.3 in the SNR.

FIG. 15A depicts optimal dimensions of polarizer segments in the semi-continuous case (for a p-polarized light beam incident on the unpatterned wafer from the left, as depicted in FIGS. 1A and 1B) under the constraint that the angular resolution is fixed (so that adjacent segments differ by the same degree). Polarization directions in the top half are rotated clockwise from the positive x-axis, and polarization directions in the bottom half are rotated anti-clockwise from the negative x-axis. Boundary lines between polarizer segments are curved, essentially as described in the description of FIGS. 2A, 2B, 3, and 4A in the Systems subsection. Each of the polarizer segments is thus substantially shaped as a curved strip.

In FIG. 15B, a subset of the boundary lines (separating polarizer segments) in the top half of the semi-continuous polarizer (i.e. the region of the polarizer defined by x>0) is shown. More specifically, shown are the first, sixth, eleventh, sixteenth, twenty-first, twenty-sixth, and thirty-first boundary lines on the top half, counting from y-axis upwards (i.e. in the direction defined by the positive x-axis). Hence, the first boundary line (indicated as 1501) separates the innermost-disposed (i.e. bottom) polarizer segment in the top half (i.e. the segment adjacent to the y-axis from above) and the second innermost-disposed polarizer segment in the top half (i.e. the segment second-closest to the y-axis from above). The innermost-disposed segment (in the top half) has a polarization angle of δ degrees (i.e. has a polarization axis that is rotated clockwise by δ degrees from the x-axis), and the second innermost-disposed segment has a polarization angle of 2·δ degrees. The sixth boundary line (indicated as 1506) separates the sixth lowest-disposed segment (characterized by a polarization angle of 6·δ degrees) and the seventh lowest-disposed segment (characterized by a polarization angle of 7·δ degrees) on the top half, and so on.

As clearly seen, the first boundary line is less curved than the sixth boundary line, which is in turn less curved than the eleventh boundary line (indicated as 1511), and so on. More specifically, the results of FIGS. 15A and 15B, as well as FIG. 14D, indicate that, optimally, the more outward-disposed a boundary line (i.e. the farther the boundary line is from a perpendicular plane bisecting the segmented polarizer into two symmetric parts), the greater the curvature thereof. Equivalently, it seems that, optimally, the more outward-disposed a polarizer segment, the more curved the polarizer segment. FIGS. 16A and 16B provide further support to this inference.

FIG. 16A shows arcs of circles (illustrated in blue) that have been respectively fitted onto (a subset of the) boundary lines (illustrated in red) on the top half of the semi-continuous polarizer of FIG. 15A. The farther an arc is positioned from the y-axis (i.e. the more outward-disposed the arc), the smaller the diameter of the respective circle (i.e. the more curved the arc). To illustrate this point, a first boundary line 1610 and a second boundary line 1620 are indicated, as well as a first circle Q' and a second circle Q" (only partially shown FIG. 16A; shown in full in FIG. 16B). The circles Q' and Q" were obtained using a fitting algorithm. Within the area defined by the polarizer, the first circle Q' virtually coincides with first boundary line 1610 and the second circle Q" virtually coincides with the second boundary line 1620. Of the two boundary lines, second boundary line 1620 is the more outward-disposed (i.e. is farther from the y-axis). Accordingly, the second circle Q" has the smaller diameter, as clearly seen in FIG. 16B.

FIG. 16B shows the circles corresponding to the arcs in full and the semi-continuous polarizer (the top half thereof is colored in red). Also indicated is a tangential component $w_t'$ of a wavevector of an incident light beam. The incident light beam is directed from left-to-right in an oblique manner, as described in the description of FIGS. 1A and 1B. Accordingly, the tangential component $w_t'$ (is parallel to the unpatterned wafer and) is directed from left-to-right. The polarizer segments accordingly taper in the direction of the positive y-axis. Further, the centers of each of the circles are positioned to the left of the x-axis (i.e. have a negative y coordinate), reflecting the fact that the boundary lines in the top half of the polarizer curve clockwise downwards, essentially as described above in the description of segmented polarizer 212.

The systems and methods, disclosed herein thus far, rely on the use of a segmented polarizer to individually address on a portion-by-portion basis different portions of a scattered light beam collected and guided, using relay optics, onto the segmented polarizer. More specifically, different polarizer segments are characterized by different polarization angles such as to substantially maximize a SNR of a typical-defect radiation signal (generated in the scattering of linearly polarized light off an unpatterned wafer).

However, it is to be understood that the portion-by-portion addressing of the scattered light beam may also be achieved using other configurations of optical components. In particular, instead of employing a segmented polarizer, a uniform (linear) polarizer may be employed together with a segmented polarization rotator (or a plurality of polarization rotators), which is positioned between the relay optics and the uniform polarizer. Each of the rotator segments (or polarization rotators when a plurality of polarization rotators is included) may be configured (and positioned) to rotate the polarization angle of a respective portion of the scattered light beam, arriving thereat, by a respective amount. The degree (amount) of rotation may be selected such that an angle between the adjusted (i.e. output) polarization direction of the respective portion of the scattered light beam and the polarization direction of the uniform polarizer matches the angle between the polarization direction of the same portion, when not subjected to polarization rotation, and the polarization direction of the respective segmented polarizer. In this manner, substantially the same suppression of background noise and increase in SNR—as in the embodiments described above including a segmented polarizer—may, in principle, be achieved by utilizing a segmented polarization rotator (or a plurality of polarization rotators) instead of a segmented polarizer.

More generally, it will be understood that a segmented polarizer and a segmented polarization rotator may be employed in conjunction to achieve substantially the same suppression of background noise and increase in SNR as in the embodiments described above including a segmented polarizer.

As used herein, according to some embodiments, the term "segmented polarizer" should be understood broadly, so as to cover any assembly (collection) of optical components, which is configured to filter light, based on polarization, in a position-dependent manner. In particular, according to some embodiments, the term "segmented polarizer" may refer to a combination of a polarizer (whether a linear polarizer or a segmented polarizer) and a segmented polarization rotator.

It is appreciated that certain features of the disclosure, which are, for clarity, described in the context of separate embodiments, may also be provided in combination in a single embodiment. Conversely, various features of the disclosure, which are, for brevity, described in the context of a single embodiment, may also be provided separately or in any suitable sub-combination or as suitable in any other described embodiment of the disclosure. No feature described in the context of an embodiment is to be considered an essential feature of that embodiment, unless explicitly specified as such.

Although operations/stages of methods according to some embodiments may be described in a specific sequence, methods of the disclosure may include some or all of the described operations/stages carried out in a different order. A method of the disclosure may include a few of the operations/stages described or all of the operations described. No particular operation/stage in a disclosed method is to be considered an essential operation of that method, unless explicitly specified as such.

As used herein, in the context of a method, the term "stage" may refer to one or more operations of the method.

Although the disclosure is described in conjunction with specific embodiments thereof, it is evident that numerous alternatives, modifications and variations that are apparent to those skilled in the art may exist. Accordingly, the disclosure embraces all such alternatives, modifications and variations that fall within the scope of the appended claims. It is to be understood that the disclosure is not necessarily limited in its application to the details of construction and the arrangement of the components and/or methods set forth herein. Other embodiments may be practiced, and an embodiment may be carried out in various ways.

The phraseology and terminology employed herein are for descriptive purpose and should not be regarded as limiting. Citation or identification of any reference in this application shall not be construed as an admission that such reference is available as prior art to the disclosure. Section headings are used herein to ease understanding of the specification and should not be construed as necessarily limiting.

What is claimed is:

1. A system for optical imaging of defects on unpatterned wafers, the system comprising an illumination module, relay optics, a segmented polarizer, and a detector;
   wherein the illumination module is configured to produce a substantially polarized light beam incident on a selectable illumination area of an unpatterned wafer;
   wherein the relay optics is configured to collect and guide, radiation scattered off the illumination area, onto the segmented polarizer;
   wherein the detector is configured to sense scattered radiation passed through the segmented polarizer; and
   wherein the segmented polarizer comprises at least four polarizer segments characterized by respective dimensions and polarization directions, such that (i) each of boundary lines, separating the polarizer segments, substantially curves outwards relative to a plane, perpendicular to the segmented polarizer, unless the boundary line is on the perpendicular plane, and (ii) when the illumination area comprises a defect, a signal-to-noise ratio (SNR) of scattered radiation, generated in the scattering of the incident light beam from the illumination area and passed through the polarizer segments, is increased as compared to when utilizing a linear polarizer.

2. The system of claim 1, wherein the perpendicular plane bisects the segmented polarizer, and, wherein, optionally, the system is configured such that an incidence plane, defined by the incident light beam, coincides with the perpendicular plane.

3. The system of claim 1, wherein each boundary line, unless on an intersection of the perpendicular plane and the segmented polarizer, defines together with (i) the intersection, and (ii) a respective pair of arcs on a circumference of the segmented polarizer, which extend from the respective boundary line to the intersection, a respective area that is convex.

4. The system of claim 1, wherein the respective dimensions and polarization directions of the polarizer segments are such that, when the illumination area comprises a defect, the SNR is substantially maximized.

5. The system of claim 4, wherein each of the polarizer segments is characterized by respective dimensions and a respective polarization direction, such that, when the illumination area comprises a defect, SNRs of scattered radiation, generated in the scattering of the incident light beam from the illumination area, and passed through the polarizer segments, respectively, are each substantially maximized.

6. The system of claim 4, wherein the boundary lines are substantially shaped as arcs of circles, which intersect the perpendicular plane.

7. The system of claim 4, wherein the illumination module is configured to produce the incident light beam at a non-zero angle with respect to an optical axis, defined by the relay optics, and wherein the substantially polarized light beam, produced by the illumination module, is substantially linearly polarized.

8. The system of claim 7, wherein the illumination module is configured to produce the incident light beam so as to be substantially p-polarized, wherein an incidence plane of the incident light beam coincides with the perpendicular plane, and wherein for each boundary line, unless the boundary line is on the perpendicular plane, the smaller a coordinate of a point on the boundary line, as measured along an axis defined by a tangential component of a wavevector of the incident light beam, the greater a distance of the point from the perpendicular plane.

9. The system of claim 1, wherein the segmented polarizer is semi-continuous, and the dimensions and polarization directions of the polarizer segments are such that, when the illumination area comprises a defect, the SNR of scattered radiation, generated in the scattering of the incident light beam from the illumination area, and passed through the polarizer segments, is increased as compared to when utilizing a radial polarizer.

10. The system of claim 1, wherein boundary lines farther from the perpendicular plane are more curved.

11. The system of claim 1, wherein the segmented polarizer is substantially set on a pupil of the relay optics, wherein an optical axis, defined by the relay optics, lies substantially on an incidence plane defined by the incident light beam, wherein the incidence plane and the perpendicular plane coincide, and wherein the polarizer segments substantially jointly exhibit mirror symmetry about the perpendicular plane.

12. The system of claim 11, wherein respective polarization directions of the polarizer segments are substantially parallel to respective tangents to an ellipse, which is bisected by the perpendicular plane, and whose center is positioned farther than a center of the segmented polarizer, as measured along an axis, defined by a tangential component of a wavevector of the incident light beam.

13. The system of claim 1, further comprising a waveplate, positioned between the segmented polarizer and the relay optics, the waveplate comprising a plurality of waveplate segments, each waveplate segment being configured to modify to a different extent, respectively, a phase between a vertical polarization component and a horizontal polarization component of scattered radiation arriving at the waveplate segment.

14. The system of claim 1, wherein each of the polarizer segments is a wire-grid polarizer.

15. The system of claim 1, wherein the polarizer segments are arranged in one or more groups of adjacently disposed strips, and wherein for each pair of adjacent polarizer segments, an absolute difference between polarization angles, defined by the polarization directions of each of the polarizer segments in the pair is smaller than each of absolute deviations of polarization angles of background noise radiation arriving at each of the polarizer segments in the pair, respectively.

16. The system of claim 1, wherein the polarizer segments are non-complementary, and wherein, optionally, the segmented polarizer comprises one or more opaque sections; and/or
wherein the system further comprises an optical mask configured to prevent one or more regions on the segmented polarizer from being exposed to radiation scattered off the unpatterned wafer, when irradiated by the illumination module, and thereby increase the SNR of the scattered radiation, passed through the segmented polarizer, and wherein each of at least four of the polarizer segments is configured to have at least a part thereof exposed to the scattered radiation.

17. A method for optical imaging of defects on unpatterned wafers, the method comprising:
irradiating an area of an unpatterned wafer with a substantially polarized light beam; and
employing relay optics to collect and guide, radiation scattered off the region, onto a segmented polarizer comprising at least four polarizer segments;
wherein respective dimensions and polarization directions of the polarizer segments are such that (i) each of boundary lines, separating the polarizer segments, substantially curves outwards relative to a plane, perpendicular to the segmented polarizer and defined by the incident light beam, unless the boundary line is on the incidence plane, and (ii) when the irradiated area comprises a defect, a signal-to-noise ratio (SNR) of scattered radiation, generated in the scattering of the incident light beam from the irradiated area and passed through the polarizer segments, is increased as compared to when utilizing a linear polarizer.

18. The method of claim 17, wherein the incident light beam is substantially p-polarized, and wherein each boundary line, which is not on the perpendicular plane, defines, together with (i) an intersection of the segmented polarizer and the perpendicular plane, and (ii) a respective pair of arcs on a circumference of the segmented polarizer, which extend from the respective boundary line to the intersection, a respective area that is convex.

19. The method of claim 17, wherein the respective dimensions and polarization directions of the polarizer segments are such that, when the irradiated area comprises a defect, the SNR is substantially maximized.

20. The method of claim 17, further comprising utilizing an optical mask to prevent one or more regions on the segmented polarizer from being irradiated by the scattered radiation, such that the SNR of the scattered radiation, passed through the segmented polarizer, is increased.

\* \* \* \* \*